(12) United States Patent
Kodama et al.

(10) Patent No.: US 6,699,635 B1
(45) Date of Patent: Mar. 2, 2004

(54) POSITIVE PHOTOSENSITIVE COMPOSITION

(75) Inventors: Kunihiko Kodama, Shizuoka (JP);
Kenichiro Sato, Shizuoka (JP);
Toshiaki Aoai, Shizuoka (JP);
Yasumasa Kawabe, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/471,007

(22) Filed: Dec. 23, 1999

(30) Foreign Application Priority Data

Dec. 24, 1998 (JP) ............................................ 10-367619

(51) Int. Cl.$^7$ .............................................. G03F 7/004
(52) U.S. Cl. ..................................... 430/270.1; 430/905
(58) Field of Search ............................... 430/270.1, 965

(56) References Cited

U.S. PATENT DOCUMENTS

| | | | | |
|---|---|---|---|---|
| 5,258,257 A | * | 11/1993 | Sinta et al. | 430/192 |
| 5,707,776 A | * | 1/1998 | Kawabe et al. | 430/270.1 |
| 5,968,712 A | * | 10/1999 | Thackeray et al. | 430/326 |
| 5,968,713 A | * | 10/1999 | Nozaki et al. | 430/326 |
| 5,985,512 A | * | 11/1999 | Hatakeyama et al. | 430/270.1 |
| 6,103,447 A | * | 8/2000 | Chen et al. | 430/270.1 |
| 6,403,288 B1 | * | 6/2002 | Nishimura et al. | 430/326 |
| 6,576,392 B1 | * | 6/2003 | Sato et al. | |

FOREIGN PATENT DOCUMENTS

| | | | |
|---|---|---|---|
| JP | 11-218927 | * | 8/1999 |
| WO | 98/37458 | * | 8/1998 |

OTHER PUBLICATIONS

"Standard Developer Available ArF Resist and Performance", Uetani, Y. et al, Proc.SPIE, 3333, pt. 1, Feb. 1998, 546–553.*
CA abstract of JP 11–218927, Aug. 1999 and machine translation of example section of JP 11–218927, Aug. 1999.*
JPO abstract of JP 11–218927, Aug. 1999.*

* cited by examiner

*Primary Examiner*—Rosemary Ashton
(74) *Attorney, Agent, or Firm*—Sughrue Mion, PLLC

(57) ABSTRACT

A positive photosensitive composition suitable for resist pattern formation under exposure to far ultraviolet light of wavelengths of 250 nm or shorter, particularly 220 nm or shorther, comprising:

(A) a resin comprising constitutional repeating units wherein particular ring structures are present and having groups capable of decomposing under the action of an acid to cause an increase of the solubility in an alkali developer, (B) a photo-acid generator capable of generating an acid upon irradiation with actinic rays or radiation, and (C) a fluorine-containing surfactant, a silicon-containing surfactant or a mixture thereof.

13 Claims, No Drawings

POSITIVE PHOTOSENSITIVE COMPOSITION

FIELD OF THE INVENTION

The present invention relates to a positive photosensitive composition used in a production process of semiconductor devices, such as IC, production of circuit substrates for liquid crystal, thermal head and the like, and other photofabrication processes. To mention in detail, the invention is concerned with a positive photosensitive composition suitable for the cases wherein far ultraviolet rays having wavelengths of 250 nm or shorter are used as exposure light.

BACKGROUND OF THE INVENTION

The compositions containing alkali-soluble resins and naphthoquinonediazide compounds as photosensitive material are generally used as positive photoresist compositions. For instance, the combinations of phenol resins of novolak type with naphthoquinonediazido-substituted compounds are disclosed in U.S. Pat. Nos. 3,666,473, 4,115,128 and 4,173,470. And L. F. Thompson, *Introduction to Microlithography*, No.2, 19, pp. 112–121, ACS Publisher, describes as the most typical compositions the combinations of cresol-formaldehyde novolak resin with trihydroxybenzophenone-1,2-naphthoquinone-diazidosulfonates.

In the positive photoresist constituted basically of a novolak resin and a naphthoquinonediazide compound, the novolak resin ensures high resistance to plasma etching, and the naphtoquinonediazide compound functions as a dissolution inhibitor. And the naphtoquinonediazide has a characteristic that it yields carboxylic acid when irradiated with light, thereby losing its dissolution-inhibiting ability to raise the solubility of the novolak resin in alkali.

From such points of view, a number of positive photoresists comprising novolak resins and photosensitive materials of naphthoquinonediazide type have so far been developed and put to practical use. As to the processing of fine patterns the minimum line width of which is at the level of 0.8–2 μm, those photoresists have achieved satisfactory results.

However, the integration degree of integrated semiconductors kept on getting higher, and the production of semiconductor substrates for VLSI and the like has come to necessitate the processing of superfine line patterns having the width on the level of half micron.

As one of means to obtain finer patterns, it is known to use an exposure light of shorter wavelengths for the resist pattern formation. This can be explained by the following Rayleigh's equation for resolution (line width) of an optical system:

$$R = k \cdot \lambda / NA$$

wherein $\lambda$ is the wavelength of exposure light, NA is the aperture number of the lens and k is a process constant. From this equation, it is understand that the high resolution, or the reduction in the value of R, can be achieved by shortening the wavelength $\lambda$ of exposure light.

For instance, in the production of DRAM having an integration degree up to 64 Mega-bit, the i-line (365 nm) of a high-pressure mercury lamp has so far been used as exposure light. In the process of mass-producing 256 Megabit DRAM, the use of KrF excimer laser beam (248 nm) as exposure light has been examined in the place of i-line. Further, the sources for exposure light of shorter wavelengths have been investigated for the purpose of producing DRAM with an integration degree of 1 Giga-bit or above, and thereby the utilization of ArF excimer laser (193 nm), $F_2$ excimer laser (157 nm), X-rays and electron beams has been considered effective (Takumi Ueno et al., *Short-wavelength Photoresist Materials—Micro-lithography for ULSI*, Bunshin Shuppan (1988)).

When the conventional resist constituted of a novolak resin and a quinonediazide compound is used for the pattern formation utilizing far ultraviolet or excimer laser lithography, it is difficult for the light to reach the depths of the resist because both novolak resin and naphthoquinonediazide have strong absorption in the far ultraviolet region. As a result, the resist sensitivity is low and the pattern obtained has a tapered profile.

As a measure to solve those problems, the chemically amplified resist compositions are disclosed in, e.g., U.S. Pat. No. 4,491,638 and European Patent No. 249, 139. The positive resist compositions of chemical amplification type are pattern-forming materials of the type which produce acids in the irradiated area when irradiated with actinic rays such as far ultraviolet rays. And the reaction catalyzed by such acids makes a difference between the solubility of the irradiated area in a developer and that of the unirradiated areas, thereby forming a pattern on a substrate.

Examples of positive resist of chemical amplification type include the compositions comprising the combinations of compounds of producing acids by photolysis with the acetal or O,N-acetal compounds (JP-A-48-89003, wherein the term "JP-A" means an "unexamined published Japanese patent application"), those with the orthoester or amidoacetal compounds (JP-A-51-120714), those with the polymers containing acetal or ketal groups in the main chain (JP-A-53-133429), those with the enol ether compounds (JP-A-55-12995), those with the N-acyliminocarbonic acid compounds (JP-A-55-126236), those with the polymers containing orthoester groups in the main chain (JP-A-56-17345), those with the tertiary alkyl ester compounds (JP-A-60-3625), those with silyl ester compounds (JP-A-60-10247) and those with the silyl ether compounds (JP-A-60-37549 and JP-A-60-121446). These compositions have high sensitivity because their quantum yields are greater than 1 in principle.

As examples of a positive resist composition of the type which decomposes on heating in the presence of an acid to become soluble in alkali, mention may be made of the compositions comprising the combinations of the compounds capable of producing acids by exposure as disclosed in JP-A-59-45439, JP-A-60-3625, JP-A-62-229242, JP-A-63-27829, JP-A-63-36240, JP-A-63-250642, JP-A-5-181279, *Polym. Eng. Sce.*, volume 23, page 1012 (1983), *ACS. Sym.*, volume 242, page 11 (1984), *Semiconductor World* 1987, November issue, page 91, *Macromolecules*, volume 21, page 1475 (1988), and *SPIE*, volume 920, page 42 (1988), with tertiary or secondary carbon (e.g., t-butyl, 2-cyclohexenyl) esters or carbonic acid ester compounds, the combinations with the acetal compounds as disclosed in JP-A-4-219757, JP-A-5-249682 and JP-A-6-65332, and the combinations with the t-butyl ether compounds as disclosed in JP-A-4-211285 and JP-A-6-65333.

The resist compositions recited above contain as their main component a resin whose basic skeleton is poly (hydroxystyrene) showing small absorption at the wavelengths around 248 nm. When KrF excimer laser is used as exposure light source, therefore, those compositions can have high sensitivity and high resolution, and moreover they can form patterns of good quality. In other words, they can be superior in performance to conventional naphthoquinonediazide/novolak resin resist.

However, in cases where the sources emitting light of further short wavelengths, such as ArF excimer laser (193 nm), are used for exposure, even the chemically amplified resist compositions recited above are inadequate since the compounds having aromatic groups essentially show strong absorption at wavelengths around 193 nm.

In addition, the use of poly(meth)acrylates showing weak absorption at wavelengths around 193 nm as resin component is described in *J. Vac. Sci. Technol.*, B9, 3357 (1991). However, such polymers have a drawback of being inferior to conventional phenol resins, wherein aromatic groups are present, in the resistance to dry etching generally carried out in the semiconductor production process.

On the other hand, it was reported in *Proc. of SPIE*, 1672, 66 (1992) that the polymers containing alicyclic groups showed dry etching resistance equivalent to that of the polymers containing aromatic groups, and that weak absorption at wavelengths around 193 nm. As a result, the utilization of such polymers has come to be examined energetically in recent years. For instance, the polymers hitherto examined are those disclosed in JP-A-4-39665, JP-A-5-80515, JP-A-5-265212, JP-A-5-297591, JP-A-5-346668, JP-A-6-289615, JP-A-6-324494, JP-A-7-49568, JP-A-7-185046, JP-A-7-191463, JP-A-7-199467, JP-A-7-234511, JP-A-7-252324 and JP-A-8-259626. However, those polymers are not necessarily sufficient in dry etching resistance, and require many steps for their syntheses.

Further, the introduction of alicyclic groups for the purpose of imparting dry etching resistance lowers the adhesion to a substrate, thereby causing delamination of resist patterns after development. As a solution to this problem, the resins comprising constitutional units having γ-butyrolactone structure are disclosed in European Patent 0856773. The use of such resins brings about improvement in the adhesion, but causes a new problem that the introduction of alicyclic groups renders the resist film highly hydrophobic to increase development defects.

SUMMARY OF THE INVENTION

An object of the present invention is to provide a positive photosensitive composition suitable for exposure to light of wavelengths of 250 nm or shorter, particularly 220 nm or shorter. More specifically, the object of the invention is to provide a positive photosensitive composition showing satisfactory sensitivity and resolution when the light of wavelengths of 250 nm or shorter, particularly 220 nm or shorter, is used for exposure, providing resist patterns having excellent adhesion and reduced development defects, and further having sufficient dry etching resistance.

The aforementioned object of the invention is attained with a positive photosensitive composition according to any of the embodiments (1) to (7) described below.

(1) A positive photosensitive composition comprising:
(A) a resin comprising repeating units represented by the following formula (I) and having groups capable of decomposing under the action of an acid to cause an increase of the solubility in an alkali developer,
(B) a photo-acid generator capable of generating an acid upon irradiation with actinic rays or radiation, and
(C) a fluorine-containing surfactant and/or a silicon-containing surfactant;

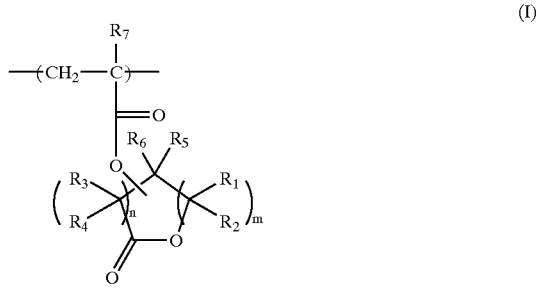

wherein $R_1$ to $R_6$, which are the same or different, each represents a hydrogen atom, an alkyl group, an alkoxy group, a hydroxyl group or a halogen atom, or at least two among $R_1$ to $R_6$ may combine with each other to form a ring; $R_7$ represents a hydrogen atom, a halogen atom, a cyano group, an alkyl group or a haloalkyl group; the ring structure and the oxygen atom are linked by a single bond at the site of any of $R_1$ to $R_6$; m is an integer of 0 to 2; and n is an integer of 0 to 2.

(2) A positive photosensitive composition as described in Item (1), wherein the resin (A) further comprises cyclic hydrocarbon group-containing repeating units.

(3) A positive photosensitive composition as described in Item (1) or (2), further comprising (D) a nitrogen-containing basic compound.

(4) A positive photosensitive composition as described in any of Items (1) to (3), wherein the photo-acid generator (B) is an iodonium salt whose anion is a fluoroalkanesulfonic acid ion or a sulfonium salt whose anion is a fluoroalkanesulfonic acid ion.

(5) A positive photosensitive composition as described in any of Items (1) to (4), further comprising (E) a low molecular compound having a molecular weight of at most 3,000 and a group capable of decomposing under the action of an acid to cause an increase of the solubility in an alkali developer.

(6) A positive photosensitive composition as described in any of Items (1) to (5), wherein the actinic rays or radiation used for irradiation is far ultraviolet light of wavelengths of 250 nm or shorter.

(7) A positive photosensitive composition as described in Item (6), wherein the far ultraviolet light is light of wavelengths of 220 nm or shorter.

DETAILED DESCRIPTION OF THE INVENTION

The resin (A), which comprises repeating units represented by the foregoing formula (I) and has groups capable of decomposing under the action of an acid to cause an increase of the solubility in an alkali developer (also referred to as acid decomposable groups), is illustrated below in detail. Hereinafter, this resin is referred to as acid-decomposable alkali-soluble Resin (A), too.

The alkyl group represented by $R_1$ to $R_6$ in formula (I) is preferably a straight-chain, branched or cyclic alkyl group containing 1 to 12 carbon atoms, which may have a substituent. Examples of such an alkyl group include a methyl group, an ethyl group, a propyl group, an n-butyl group, a sec-butyl group, a hexyl group, a 2-ethylhexyl group, an octyl group, a cyclopropyl group and a cyclopentyl group.

The alkoxy group represented by $R_1$ to $R_6$ is preferably an alkoxy group containing 1 to 8 carbon atoms, which may have a substituent. Examples of such an alkoxy group include a methoxy group, an ethoxy group, a hydroxyethoxy group, a propoxy group, a hydroxypropoxy group and a butoxy group.

As examples of a substituent which the groups represented by $R_1$ to $R_6$ may have, mention may be made of an alkyl group, an alkenyl group, an alkoxy group, an acyloxy group and a halogen atom.

At least two among $R_1$ to $R_6$ may combine with each other to form a moncyclic or polycyclic ring, in which an oxygen atom, a sulfur atom, a nitrogen atom, a ketone linkage, an ester linkage, an imide linkage or an amide linkage may be contained. More specifically, the ring formed may have a 5- to 8-membered monocyclic structure, or a polycyclic structure having at least two 5- to 8-membered rings, with examples including a cyclohexane ring, a cyclopentane ring, a tetrahydropyran ring, a piperidine ring, a tetrahydropyrrole ring, a cyclohexanone ring and a butyrolactone ring.

$R_7$ represents a hydrogen atom, a halogen atom, a cyano group, an alkyl group or a haloalkyl group.

The alkyl group represented by $R_7$ is preferably an alkyl group containing 1 to 4 carbon atoms, such as a methyl group, an ethyl group, a propyl group, an n-butyl group or a sec-butyl group, which may have a substituent. The haloalkyl group represented by $R_7$ is preferably a fluorine-, chlorine- or bromine-substituted alkyl group containing 1 to 4 carbon atoms, with examples including a fluoromethyl group, a chloromethyl group, a bromomethyl group, a fluoroethyl group, a chloroethyl group and a bromoethyl group.

It is preferred that the sum of m and n in formula (I) is 2. It is more preferred that m and n each is 1 and the oxygen atom of the —COO— residue is bonded to $R_3$ or $R_4$ of the lactone residue (ring structure) through a single bond.

The acid-decomposable alkali-soluble Resin (A) may contain acid decomposable groups in the constitutional repeating units represented by formula (I), other constitutional repeating units, or some of these units. The content of repeating units having acid-decomposable groups in the acid-decomposable alkali-soluble Resin (A) is generally 20 mol % or more, preferably 30 mol % or more, more preferably 40 mol % or more.

Examples of an acid decomposable group include groups capable of forming an acid when hydrolyzed under the action of an acid, and groups capable of forming an acid when the carbon cation is eliminated therefrom by the action of an acid. These groups are preferably represented by the following formula (x) or (y), and thereby excellent aging stability is ensured:

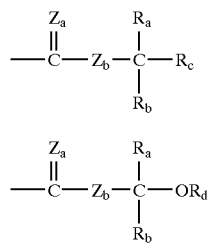

(x)

(y)

wherein $R_a$, $R_b$ and $R_c$, which may be the same or different, each represents a hydrogen atom, or an unsubstituted or substituted alkyl, cycloalkyl or alkenyl group, provided that at least one among $R_a$, $R_b$ and $R_c$ in formula (x) is a group other than a hydrogen atom. $R_d$ represents an unsubstituted or substituted alkyl, cycloalkyl or alkenyl group. Further, any two among $R_a$, $R_b$ and $R_c$ in formula (X) or any two among $R_a$, $R_b$ and $R_d$ in formula (y) may combine with each other to form a ring structure containing 3 to 8 carbon atoms and a hetero atom. Examples of such a ring structure include a cyclopropyl group, a cyclopentyl group, a cyclohexyl group, a cycloheptyl group, 1-cyclohexenyl group, a 2-tetrahydrofuranyl group and a 2-tetrahydropyranyl group.

$Z_a$ and $Z_b$, which may be the same or different, each represents an oxygen atom or a sulfur atom.

The alkyl group represented by $R_a$ to $R_d$ is preferably an alkyl group containing 1 to 8 carbon atoms, such as a methyl group, an ethyl group, a propyl group, an n-butyl group, a sec-butyl group, a hexyl group, a 2-ethylhexyl group or an octyl group, which may have a substituent. The cycloalkyl group represented by $R_a$ to $R_d$ is a cyloalkyl group containing 3 to 8 carbon atoms, such as a cyclopropyl group, a cyclopentyl group or a cyclohexyl group, which may have a substitutent. The alkenyl group represented by $R_a$ to $R_d$ is preferably an alkenyl group containing 2 to 6 carbon atoms, such as a vinyl group, a propenyl group, an allyl group, a butenyl group, a pentenyl group, a hexenyl group or a cyclohexenyl group, which may have a substituent.

As suitable examples of a substituent the groups recited above may have, mention may be made of a hydroxyl group, a halogen atom (specifically a fluorine, chlorine, bromine or iodine atom), a nitro group, a cyano group, an amido group, a sulfonamido group, an alkyl group (e.g., a methyl group, an ethyl group, a propyl group, a n-butyl group, a sec-butyl group, a hexyl group, a 2-ethylhexyl group, an octyl group), an alkoxy group (e.g., a methoxy group, an ethoxy group, a hydroxyethoxy group, a propoxy group, a hydroxypropoxy group, a butoxy group), an alkoxycarbonyl group (e.g., a methoxycarbonyl group, an ethoxycarbonyl group), an acyl group (e.g., a formyl group, an acetyl group, a benzoyl group), an acyloxy group (e.g., an acetoxy group, a butyryloxy group) and a carbonyl group.

The proportion of the constitutional repeating units represented by formula (I) in the acid-decomposable alkali-soluble Resin (A) is adjusted so as to attain a proper balance between dry etching resistance and alkali developability. More specifically, the suitable proportion is at least 20 mole %, preferably from 30 to 80 mole %, particularly preferably from 40 to 70 mole %, to the total constitutional repeating units.

Representatives of the constitutional repeating units represented by formula (I) are units of (a1) to (a14) illustrated below, but it should be understood that these examples are not to be construed as limiting the scope of the invention.

(a1)

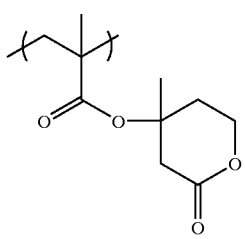

(a2) 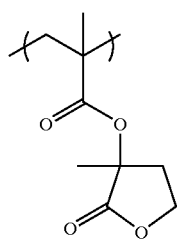
(a3) 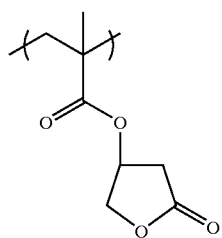
(a4) 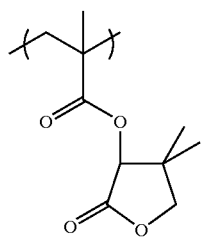
(a5) 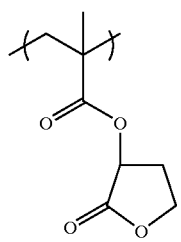
(a6) 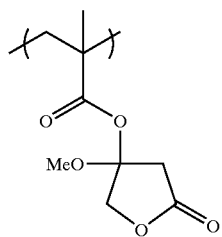
(a7) 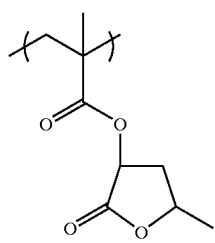
(a8) 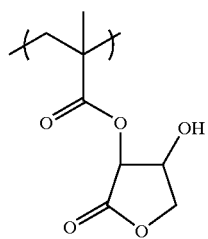
(a9) 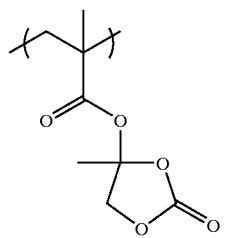
(a10) 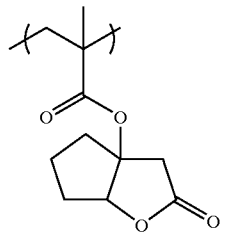
(a11) 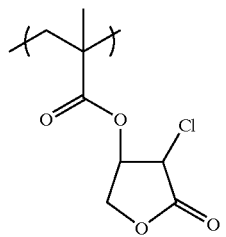
(a12) 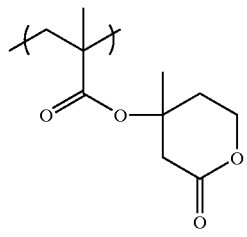
(a13) 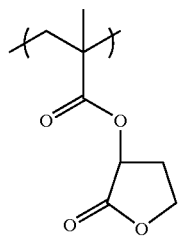

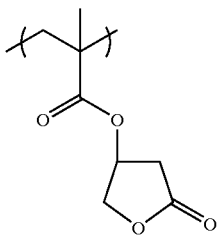

(a14)

In addition to the constitutional repeating units of formula (I), the resin (A) having groups capable of decomposing under the action of an acid to cause an increase of the solubility in an alkali developer can further comprise constitutional repeating units having monocyclic or polycyclic hydrocarbon groups.

The constitutional unit having a monocyclic or polycyclic hydrocarbon group is preferably a cyclic hydrocarbon group-containing constitutional unit represented by the following formula (II), (III) or (IV):

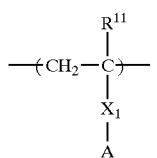

(II)

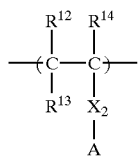

(III)

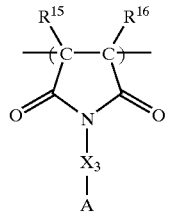

(IV)

wherein $R_{11}$, $R_{12}$, $R_{14}$, $R_{15}$ and $R_{16}$, which may be the same or different, each represents a hydrogen atom, a halogen atom, a cyano group, an alkyl group or a haloalkyl group; $R_{13}$ represents a cyano group, —CO—O$R_{23}$ or —CO—N$R_{24}R_{25}$; $X_1$, $X_2$ and $X_3$, which may be the same or different, each represents a single bond, a divalent unsubstituted or substituted alkylene, alkenylene or cycloalkylene group, —O—, —SO$_2$—, —OCO—$R_{26}$—, —CO—O—$R_{27}$— or —CO—N$R_{28}$—$R_{29}$—; $R_{23}$ represents a hydrogen atom, an unsubstituted or substituted alkyl, cycloalkyl or alkenyl group, or a group capable of decomposing under the action of an acid to increase the solubility in an alkali developer; $R_{24}$, $R_{25}$, and R28, which may be the same or different, each represents a hydrogen atom or an unsubstituted or substituted alkyl, cycloalkyl or alkenyl group, or $R_{24}$ and $R_{25}$ may combine with each other to form a ring; $R_{26}$, $R_{27}$ and $R_{29}$, which may be the same or different, each represents a single bond, or an alkylene, alkenylene or cycloalkylene group which may combine with an ether, ester, amido, urethane or ureido linkage to form another divalent group; and A represents a monocyclic or polycyclic hydrocarbon group.

The alkyl group represented by $R_{23}$, $R_{24}$, $R_{25}$ and $R_{28}$ each preferably is an alkyl group containing 1 to 8 carbon atoms, such as a methyl group, an ethyl group, a propyl group, a n-butyl group, a sec-butyl group, a hexyl group, a 2-ethylhexyl group or an octyl group, which may have a substituent. The cycloalkyl group represented by $R_{23}$, $R_{25}$, $R_{25}$ and $R_{28}$ each preferably is a cyloalkyl group containing 3 to 8 carbon atoms, such as a cyclopropyl group, a cyclopentyl group or a cyclohexyl group, which may have a substitutent. The alkenyl group represented by $R_{23}$, $R_{25}$, $R_{25}$ and $R_{28}$ each preferably is an alkenyl group containing 2 to 6 carbon atoms, such as a vinyl group, a propenyl group, an allyl group, a butenyl group, a pentenyl group, a hexenyl group or a cyclohexenyl group, which may have a substituent.

The alkyl group represented by $R_{11}$, $R_{12}$, $R_{14}$, $R_{15}$ and $R_{16}$ each is an alkyl group containing 1 to 4 carbon atoms, such as a methyl group, an ethyl group, a propyl group, an n-butyl group or a sec-butyl group, which may have a substituent. The haloalkyl group represented by $R_{11}$, $R_{12}$, $R_{14}$, $R_{15}$ and $R_{16}$ each preferably is a fluorine-, chlorine- or bromine-substituted alkyl group containing 1 to 4 carbon atoms, with examples including a fluoromethyl group, a chloromethyl group, a bromomethyl group, a fluoroethyl group, a chloroethyl group and a bromoethyl group.

As examples of an alkylene group, an alkenylene group and a cycloalkylene group which $R_{26}$, $R_{27}$, $R_{29}$, $X_1$, $X_2$ and $X_3$ each can represent, mention may be made of divalent groups derived from the above-recited alkyl groups, alkenyl groups and cycloalkyl groups, respectively. In addition to those groups, $R_{26}$, $R_{27}$ and $R_{29}$ each can include the divalent groups formed by combining any of those divalent groups with at least one linkage selected from among ether, ester, amido, urethane and ureido linkages.

In a case where $R_{24}$ and $R_{25}$ are combined and form a ring together with the nitrogen atom, the ring formed is preferably a 5- to 8-membered ring, with examples including pyrrolidine, piperidine and piperazine.

The group capable of decomposing under the action of an acid to cause an increase of the solubility in an alkali developer (an acid decomposable group), which $R_{23}$ can represent, has the same meaning as the aforementioned acid decomposable group, and suitable examples thereof include the same ones as recited above.

The monocyclic hydrocarbon group represented by A is generally a group containing at least 3 carbon atoms and having a cyclic hydrocarbon skeleton (e.g., cyclopropane, cyclobutane, cyclopentane, cyclohyexane) which may be substituted, preferably an alicyclic group containing 3 to 8 carbon group.

The polycyclic hydrocarbon group represented by A is preferably an unsubstituted or substituted alicyclic group containing at least 5 carbon atoms, which is derived from a bicyclo-, tricyclo- or tetracycloalkane, more preferably an unsubstitured or substituted polycyclic type of alicyclic group containing 6 to 30 carbon atoms, particularly 7 to 25 carbon atoms.

As suitable examples of a substituent which the polycyclic type of alicyclic group as recited above can have, mention may be made of a hydroxyl group, halogen atoms (e.g., fluorine, chlorine, bromine, iodine), a nitro group, a cyano group, an amido group, a sulfonamido group, the alkyl groups recited in the description of $R_{23}$, alkoxy groups containing 1 to 8 carbon atoms (e.g., a methoxy group, an ethoxy group, a hydroxyethoxy group, a propoxy group, a hydroxypropoxy group, a butoxy group), alkoxycarbonyl groups (e.g., a methoxycarbonyl group, an ethoxycarbonyl group), acyl groups (e.g., a formyl group, an acetyl group, a benzoyl group), acyloxy groups (e.g., an acetoxy group, a butyryloxy group) and a carboxyl group.
Representative structures of the alicyclic moieties of the polycyclic or monocyclic hydrocarbon groups recited above are illustrated below:
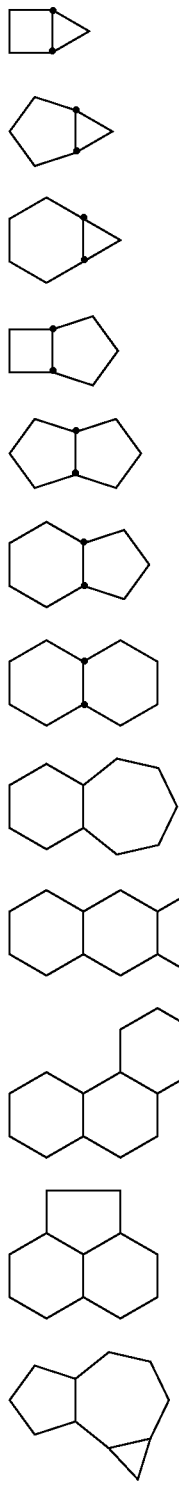
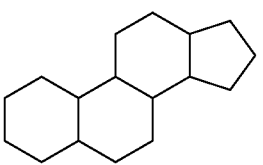
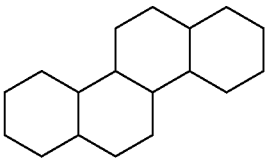
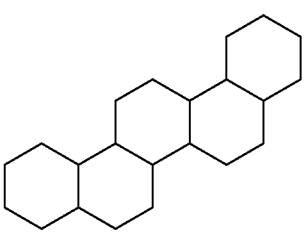
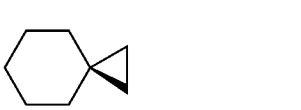
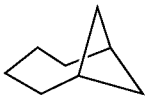

-continued
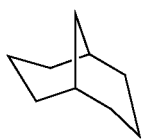
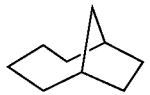
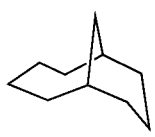
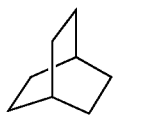
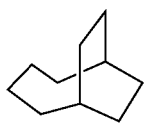
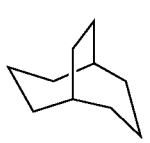
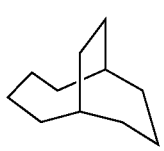
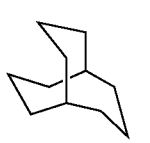
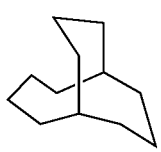
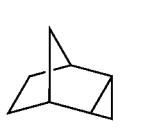
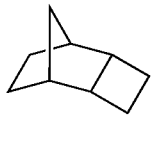
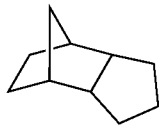
-continued
(25) 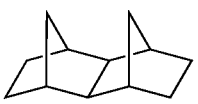
(26) 
(27) 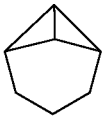
(28) 
(29) 
(30) 
(31) 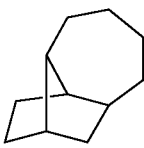
(32) 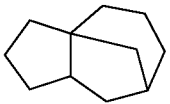
(33) 
(34) 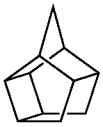
(35) 
(36) 

(50)

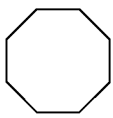

The proportion of the foregoing cyclic hydrocarbon group-containing constitutional units (preferably the constitutional repeating units of formulae (II) to (IV)) in the acid-decomposable alkali-soluble resin (A) is adjusted so as to attain a proper balance between dry etching resistance and alkali developability. Specifically, it is desirable that the cyclic hydrocarbon group-containing constitutional units be present in a proportion of at least 20 mole %, preferably from 30 to 80 mole %, more preferably from 35 to 70 mole %, particularly preferably from 40 to 60 mole %, to the total constitutional repeating units of the resin (A).

The suitable ratio of the constitutional repeating units of formula (I) to the monocyclic or polycyclic hydrocarbon group-containing constitutional repeating units in the acid-decomposable alkali-soluble resin (A) is from 80:20 to 20:80, preferably from 70:30 to 30:70. Additionally, the monocyclic or polycyclic hydrocarbon moiety may be present in the constitutional repeating unit of formula (I).

Examples of constitutional repeating units represented by formulae (II) to (IV) respectively are illustrated below, but it should be understood that these examples are not to be construed as limiting the scope of the invention in any way.

(b1)

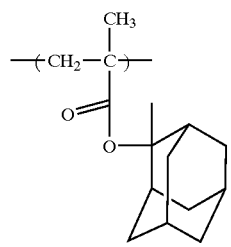

(b2)

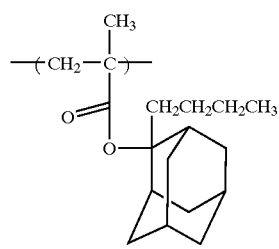

(b3)

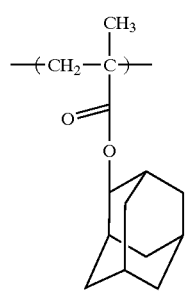

(B4)

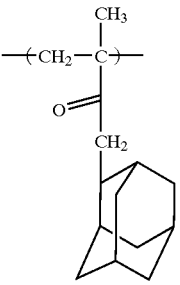

(b5)

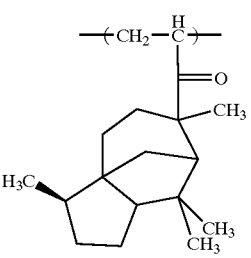

(b6)

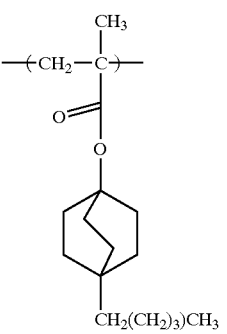

(b7)

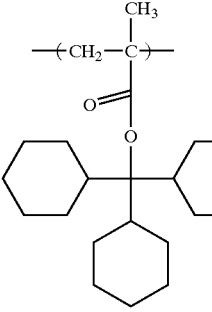

(b8)

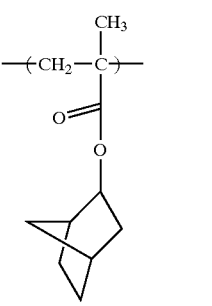

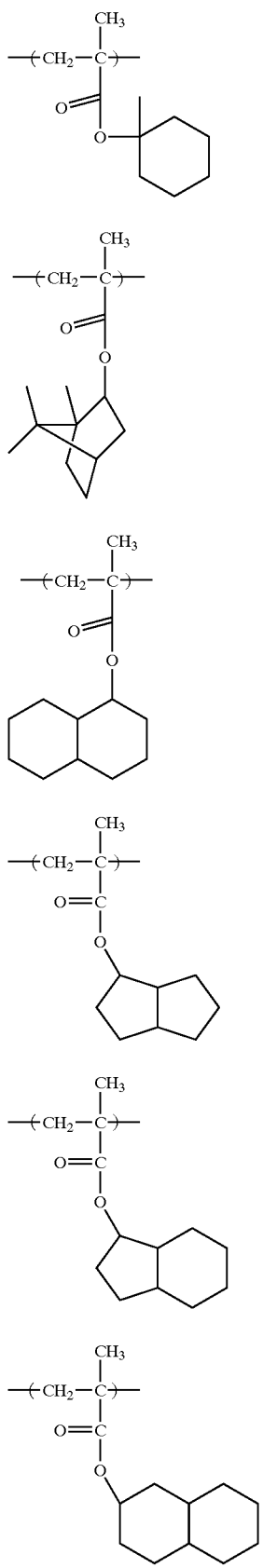
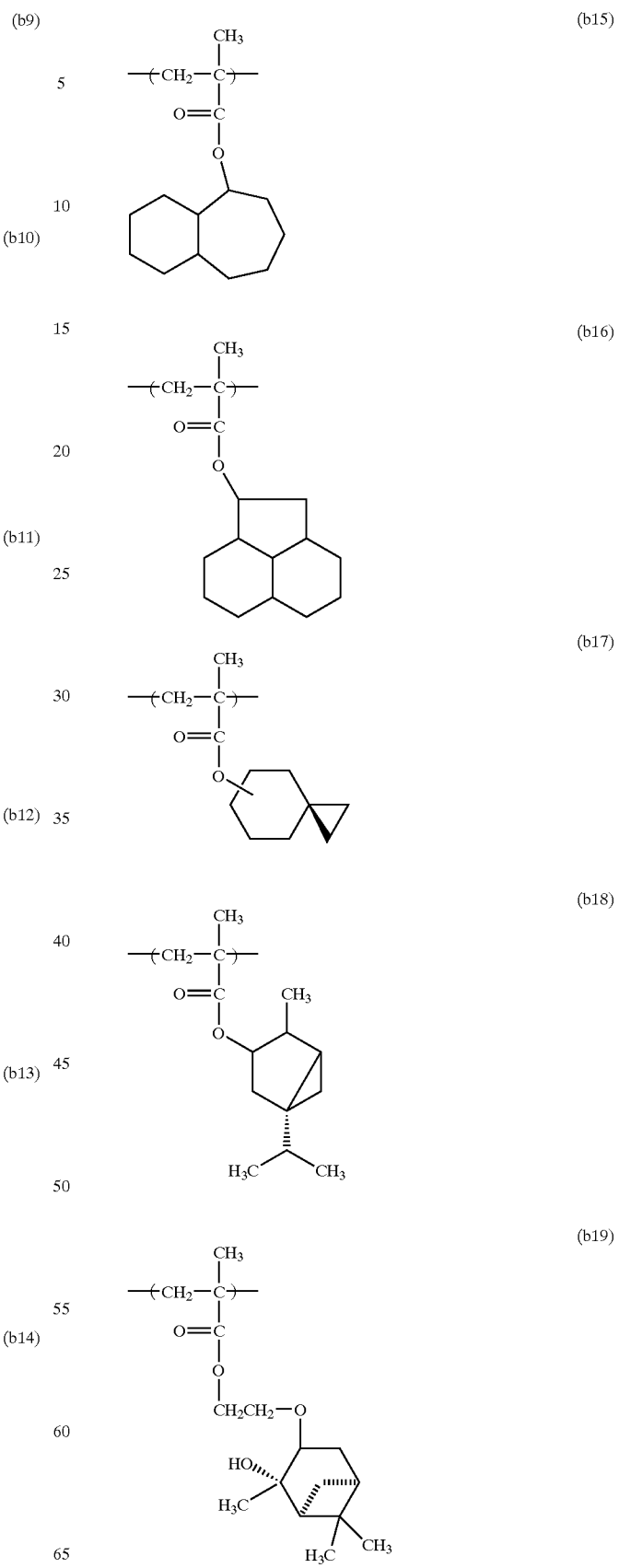

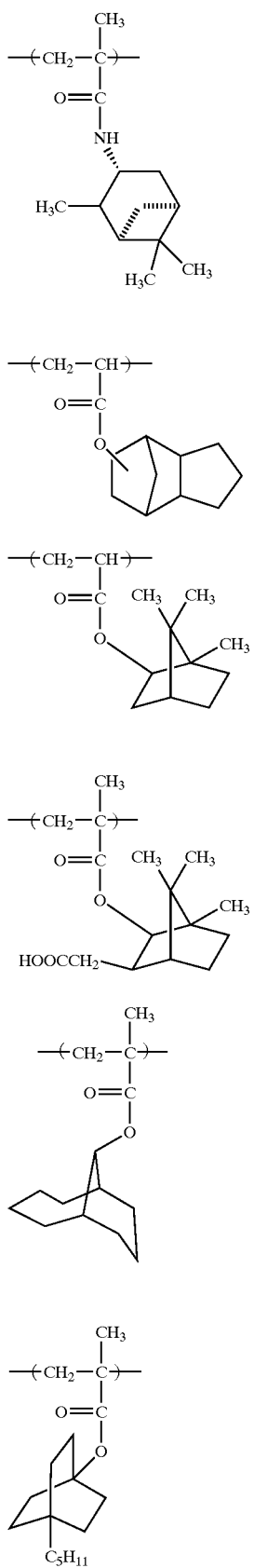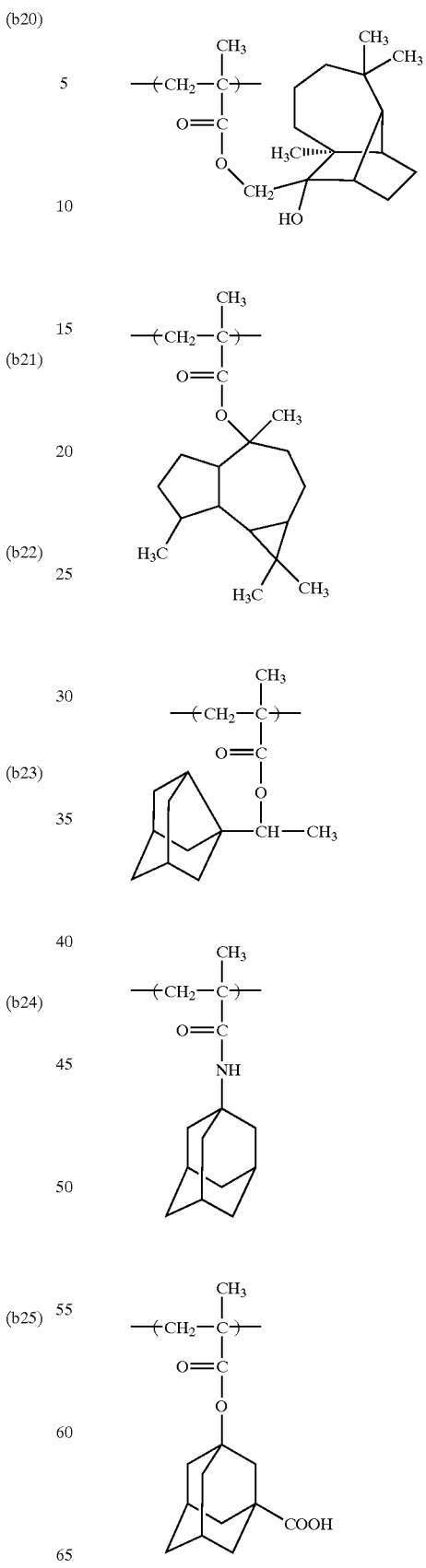

-continued
(b31)
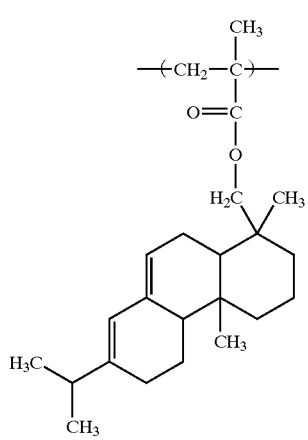
(b32)
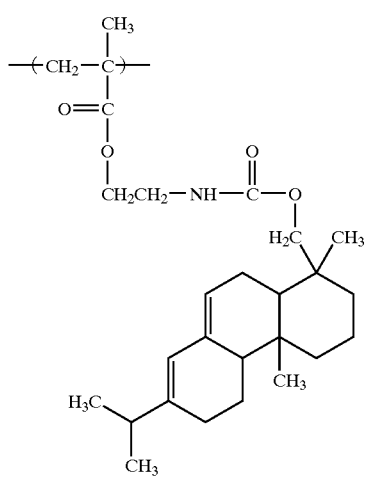
(b33)
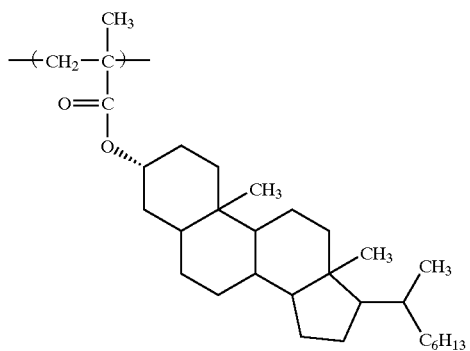
-continued
(b34)
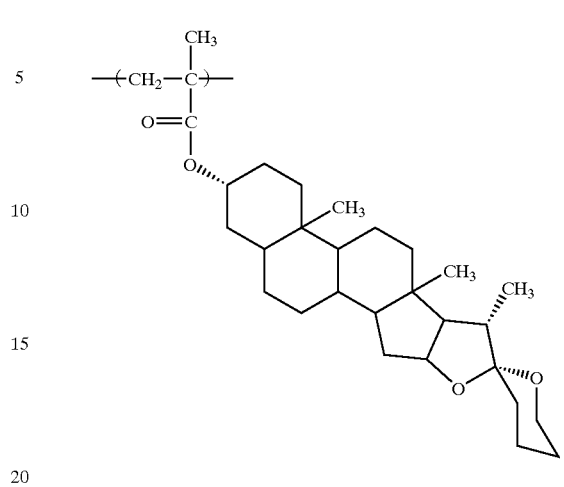
(b35)
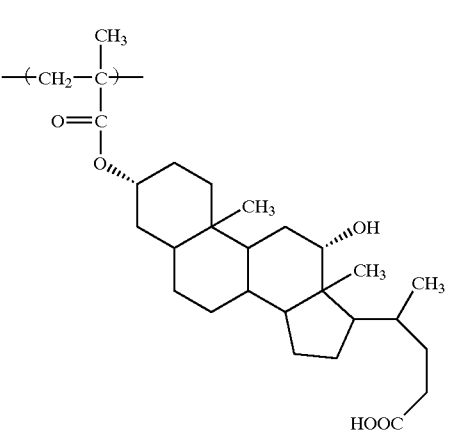
(b36)
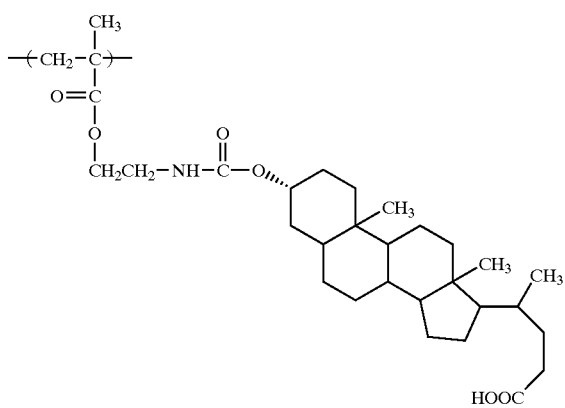

(b37) 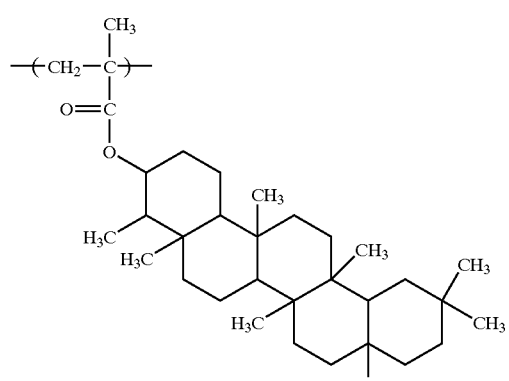
(b38) 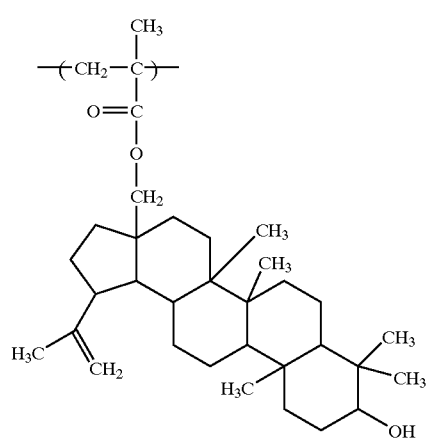
(b39) 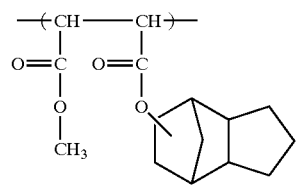
(b40) 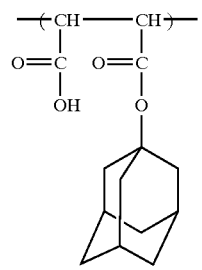
(b41) 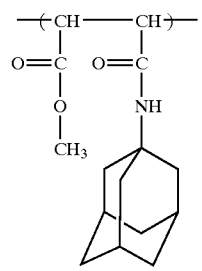
(b42) 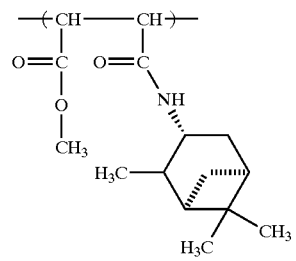
(b43) 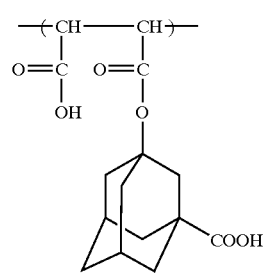
(b44) 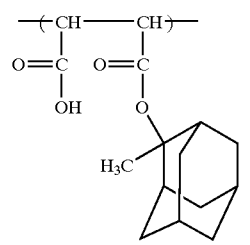
(b45) 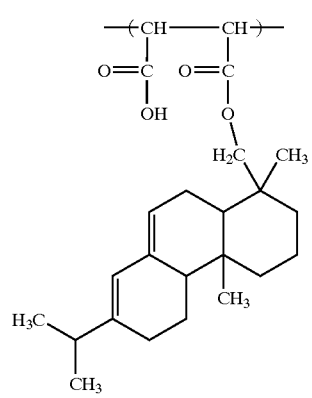
(b46) 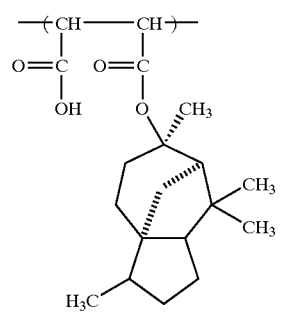

(b47)

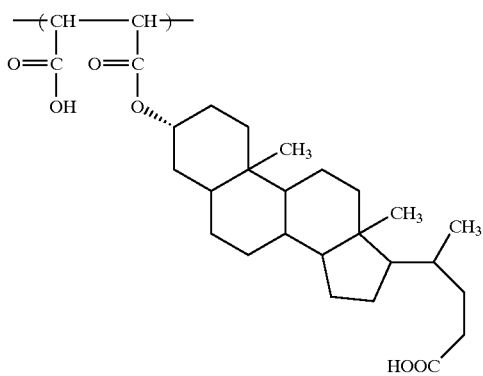

(b50)

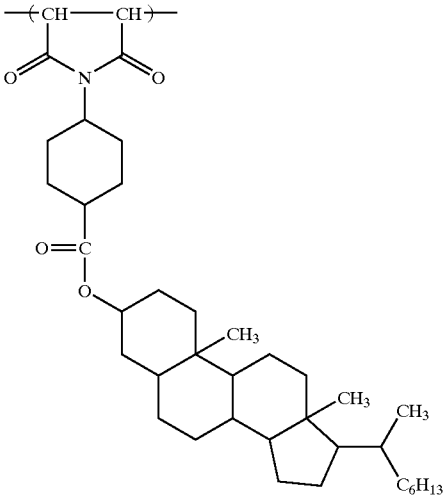

(b48)

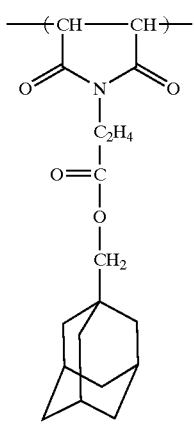

Further, the acid-decomposable alkali-soluble resin (A) can also have constitutional repeating units represented by any of the following formulae (V), (VI) and (VII):

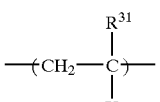 (V)

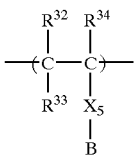 (VI)

(b49)

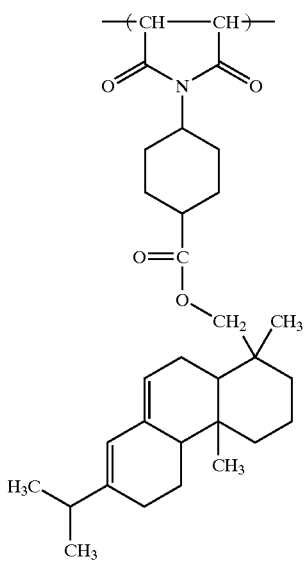

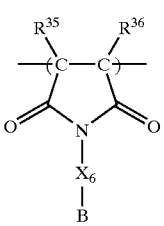 (VII)

wherein $R_{31}$, $R_{32}$, $R_{34}$, $R_{35}$ and $R_{36}$, which maybe the same or different, each represents a hydrogen atom, a halogen atom, a cyano group, an alkyl group or a haloalkyl group; $R_{33}$ represents a cyano group, —CO—O$R_{43}$ or —CO—N$R_{44}R_{45}$; $X_4$, $X_5$ and $X_6$, which may be the same or different, each represents a single bond, a divalent unsubstituted or substituted alkylene, alkenylene or cycloalkylene group, —O—, —SO$_2$—, —OCO—R$_{46}$—, —CO—O—

$R_{47}$— or —CO—$NR_{48}$—$R_{49}$—; $R_{43}$ represents a hydrogen atom, an unsubstituted or substituted alkyl, cycloalkyl or alkenyl group, or a group capable of decomposing under the action of an acid to increase the solubility in an alkali developer; $R_{44}$, $R_{45}$ and $R_{48}$, which may be the same or different, each represents a hydrogen atom or an unsubstituted or substituted alkyl, cycloalkyl or alkenyl group, or $R_{44}$ and $R_{45}$ may combine with each other to form a ring; $R_{46}$, $R_{47}$ and $R_{49}$, which may be the same or different, each represents a single bond, or an alkylene, alkenylene or cycloalkylene group which may combine with an ether, ester, amido, urethane or ureido linkage to form another divalent group; and B represents a group capable of decomposing under the action of an acid to increase the solubility in an alkali developer, and has the same meaning as the acid decomposable group for $R_{13}$ in formulae (II) to (IV).

$R_{31}$ to $R_{36}$, $R_{43}$ to $R_{49}$ and $X_4$ to $X_6$ have the same meanings as $R_{11}$ to $R_{16}$, $R_{23}$ to $R_{26}$ and $X_1$ to $X_3$ in formulae (II) to (IV), respectively, and suitable examples of the former members are the same as those of the latter members respectively, too.

The proportion of the constitutional repeating units represented by formulae (V) to (VII) in the acid-decomposable alkali-soluble resin (A) is adjusted so as to meet the requirements for alkali developability, adhesion to substrate and so on. Specifically, it is desirable that those units be used in a proportion of 0 to 80 mole %, preferably 0 to 70 mole %, particularly preferably 0 to 60 mole %, to the total constitutional repeating units of the resin (A).

Examples of constitutional repeating units represented by formulae (V) to (VII) are illustrated below, but the invention should not be construed as being limited to these examples.

(c1)
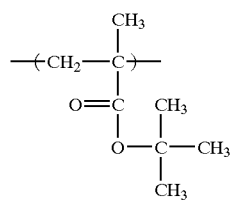

(c2)
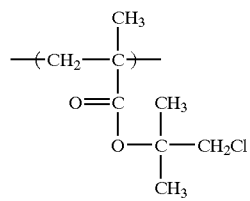

(c3)
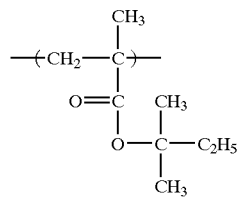

(c4)
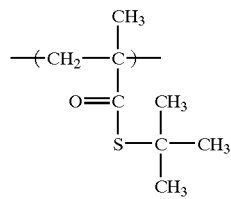

-continued (c5)
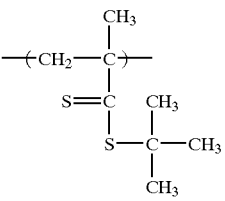

(c6)
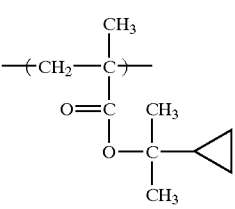

(c7)
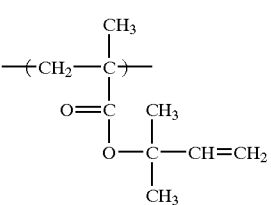

(c8)
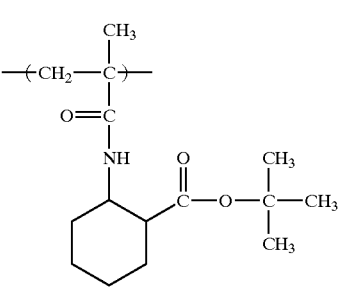

(c9)
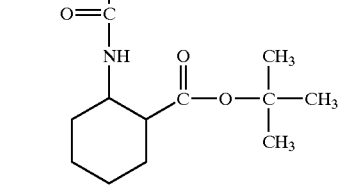

(c10)
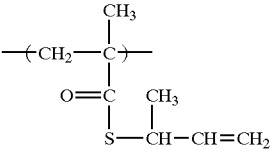

(c11)
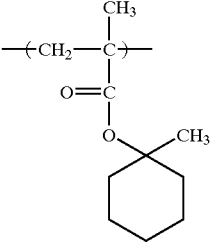

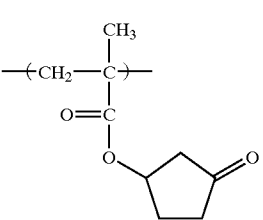

(c12) 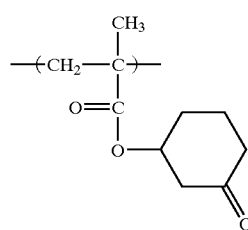
(c13) 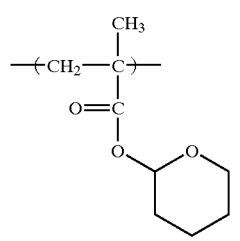
(c14) 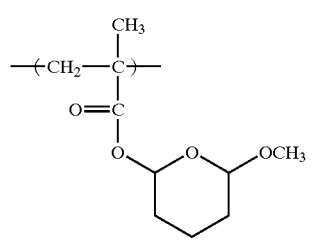
(c15) 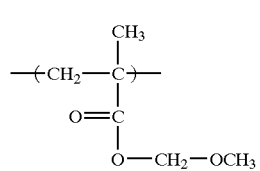
(c16) 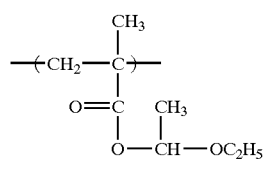
(c17) 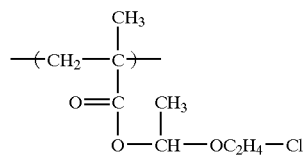
(c18) 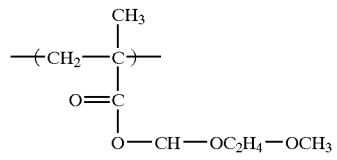
(c19) 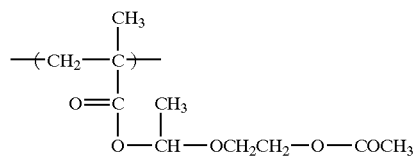
(c20) 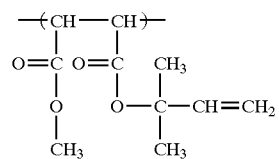
(c21) 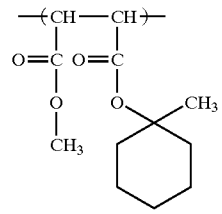
(c22) 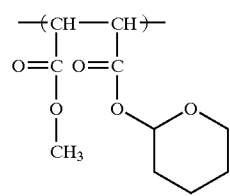
(c23) 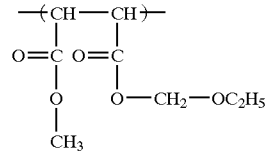
(c24) 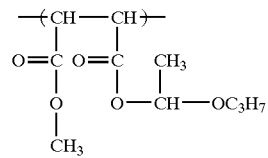
(c25) 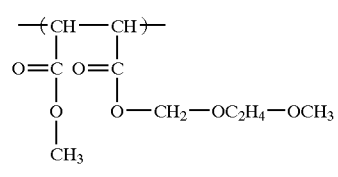
(c26) 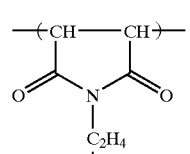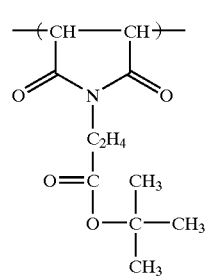

(c27)
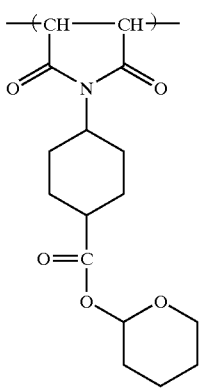

(c28)
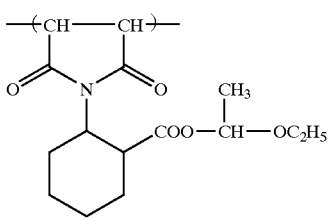

Furthermore, the acid-decomposable alkali-soluble resin (A) can contain carboxyl groups.

The carboxyl groups may be present in any of the constitutional repeating units of formulae (I) to (VII), constitutional repeating units containing acid decomposable groups, or other constitutional repeating units. And the low molecular compound (E) described hereinafter may contain a carboxyl group. Additionally, each of the constitutional repeating units as recited above may have two or more substitution sites for carboxyl group.

The suitable carboxyl group-containing constitutional repeating units are constitutional repeating units represented by the following formulae (VIII) to (X), respectively:

(VIII)
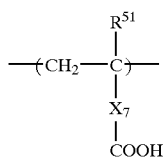

(IX)
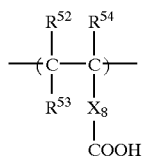

(X)
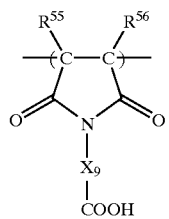

wherein $R_{51}$, $R_{52}$, $R_{54}$, $R_{55}$ and $R_{56}$, which may be the same or different, each represents a hydrogen atom, a halogen atom, a cyano group, an alkyl group or a haloalkyl group; $R_{53}$ represents a cyano group, —CO—$OR_{63}$ or —CO—$NR_{64}R_{65}$; $X_7$, $X_8$ and $X_9$, which may be the same or different, each represents a single bond, a divalent unsubstituted or substituted alkylene, alkenylene or cycloalkylene group, —O—, —$SO_2$—, —OCO—$R_{66}$—, —CO—O—$R_{67}$— or —CO—$NR_{68}$—$R_{69}$—; $R_{63}$ represents a hydrogen atom, an unsubstituted or substituted alkyl, cycloalkyl or alkenyl group, or a group capable of decomposing under the action of an acid to increase the solubility in an alkali developer; $R_{64}$ $R_{65}$ and $R_{68}$, which may be the same or different, each represents a hydrogen atom or an unsubstituted or substituted alkyl, cycloalkyl or alkenyl group, or $R_{64}$ and $R_{65}$ combine with each other to form a ring; and $R_{66}$, $R_{67}$ and $R_{69}$, which may be the same or different, each represents a single bond, or an alkylene, alkenylene or cycloalkylene group which may combine with an ether, ester, amido, urethane or ureido linkage to form another divalent group.

$R_{51}$ to $R_{56}$, $R_{63}$ to $R_{69}$ and $X_7$ to $X_9$ have the same meanings as $R_{11}$ to $R_{16}$, $R_{23}$ to $R_{29}$ and $X_1$ to $X_3$ in formulae (II) to (IV) respectively, and suitable examples of the former members are the same as those of the latter members respectively, too.

The proportion of the carboxyl group-containing constitutional repeating units (preferably the constitutional repeating units represented by formulae (VIII) to (X)) in the acid-decomposable alkali-soluble Resin (A) is adjusted so as to meet the requirements for performance such as alkali developability, adhesion to substrate and sensitivity. Specifically, it is desirable that those units be used in a proportion of 0 to 60 mole %, preferably 0 to 40 mole %, particularly preferably 0 to 20 mole %, to the total constitutional repeating units. Herein, the proportion of carboxyl group-containing constitutional repeating units refers to the proportion of the total carboxyl group-containing constitutional repeating units in resins, including the proportion of the carboxyl group-containing constitutional repeating units represented by formulae (VIII) to (X), that of a low molecular compound as described hereinafter as Component (E) and that of the constitutional repeating units containing not only acid decomposable group but also carboxyl group.

Examples of constitutional repeating units represented by formulae (VIII) to (X) are illustrated below, but the invention should not be construed as being limited to these examples.

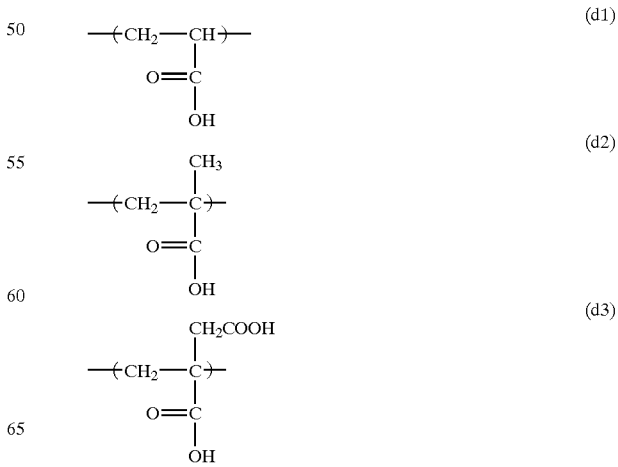

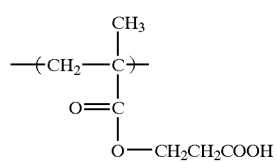 (d4)
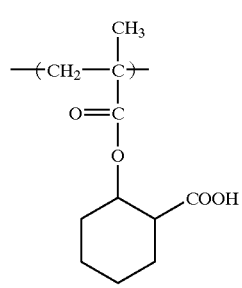 (d5)
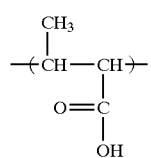 (d6)
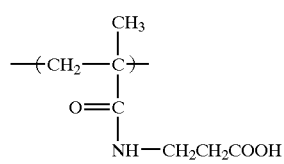 (d7)
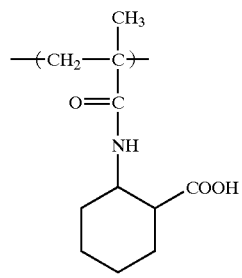 (d8)
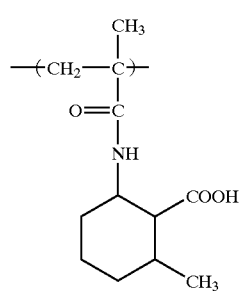 (d9)
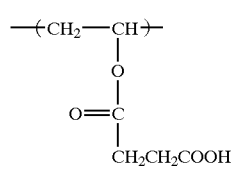 (d10)
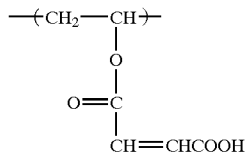 (d11)
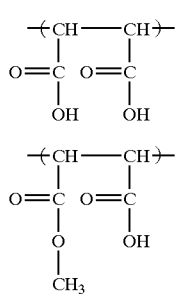 (d12)
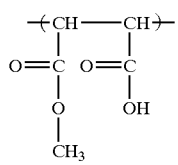 (d13)
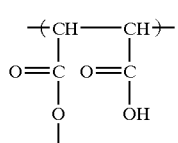 (d14)
 (d15)
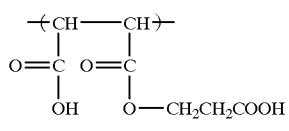 (d16)
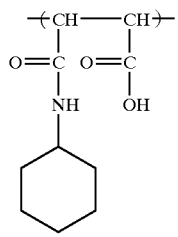 (d17)
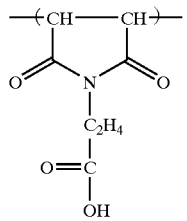 (d18)
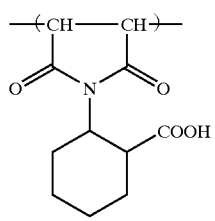
For the purpose of further improving the properties of the acid-decomposable alkali-soluble Resin (A), the resin may contain constitutional repeating units derived from other copolymerizing monomers within the limits of no serious damage to the transmittance at wavelengths of 220 nm or shorter and the dry etching resistance.

The copolymerizing monomers usable for the foregoing purpose are compounds containing one per molecule of addition polymerizable unsaturated bond, such as acrylic acid esters, acrylamides, methacrylic acid esters, methacrylamides, allyl compounds, vinyl ethers, vinyl esters, styrenes and crotonic acid esters.

Examples of usable acrylic acid esters include alkyl (preferably containing 1 to 10 carbon atoms) acrylates (e.g., methyl acrylate, ethyl acrylate, propyl acrylate, t-butyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate,tetrahydrofurfuryl acrylate) and aryl acrylates (e.g., phenyl acrylate and hydroxyphenyl acrylate); examples of usable methacrylic acid esters include alkyl (preferably containing 1 to 10 carbon atoms) methacrylates (e.g., methyl methacrylate, ethyl methacrylate, propyl methacrylate, isopropyl methacrylate, t-butyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydrooxypropyl methacrylate, trimethylolpropane monomethacrylate, pentaerythritol monomethacrylate, glycidyl methacrylate, furfuryl methacrylate, tetrahydrofurfuryl methacrylate) and aryl methacrylates (e.g., phenyl methacrylate, hydroxyphenyl methacrylate, cresyl methacrylate, naphthyl methacrylate); examples of usable acrylamides include acrylamide, N-alkylacrylamides (the alkyl moieties of which are those containing 1 to 10 carbon atoms, such as methyl, ethyl, propyl, butyl, t-butyl, heptyl, octyl, cyclohexyl, benzyl and hydroxyethyl groups), N-arylacrylamides (the aryl moieties of which are, e.g., phenyl, tolyl, nitrophenyl, naphthyl, cyanophenyl, hydroxyphenyl and carboxyphenyl groups), N,N-dialkylacrylamides (the alkyl moieties of which are those containing 1 to 10 carbon atoms, such as methyl, ethyl, butyl, isobutyl, ethylhexyl and cyclohexyl groups), N,N-diarylacrylamides (the aryl moieties of which are, e.g., phenyl groups), N-methyl-N-phenylacrylamide, N-hydroxyethyl-N-methylacrylamide and N-2-acetamidoethyl-N-acetylacrylamide; examples of usable methacrylamides include methacrylamide, N-alkylmethacrylamides (the alkyl moieties of which are those containing 1 to 10 carbon atoms, such as methyl, ethyl, t-butyl, ethylhexyl, hydroxyethyl and cyclohexyl groups), N-arylmethacrylamides (the aryl moieties of which are, e.g., phenyl, hydroxyphenyl, and carboxyphenyl groups), N,N-dialkylmethacrylamides (the alkyl moieties of which are, e.g., ethyl, propyl and butyl groups), N,N-diarylmethacrylamides (the aryl moieties of which are, e.g., phenyl groups), N-hydroxyethyl-N-methylmethacrylamide, N-methyl-N-phenyl-methacrylamide and N-ethyl-N-phenylmethacrylamide; examples of usable allyl compounds include allyl esters, such as allyl acetate, allyl caproate, allyl caprylate, allyl laurate, allyl palmitate, allyl stearate, allyl benzoate, allyl acetoacetate and allyl lactate, and allyloxyethanol; examples of usable vinyl ethers include alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether) and vinyl aryl ethers (e.g., vinyl phenyl ether, vinyl tolyl ether, vinyl chlorophenyl ether, vinyl 2,4-dichlorophenyl ethehr, vinyl naphthyl ether, vinyl anthranyl ether); examples of usable vinyl esters include vinyl butyrate, vinyl isobutyrate, vinyl trimethylacetate, vinyl diethylacetate, vinyl valeate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl β-phenylbutyrate, vinyl cyclohexylcarboxylate, vinyl benzoate, vinyl salicylate, vinyl chlorobenzoate, vinyl tetrachlorobenzoate and vinyl naphthoate; examples of usable styrenes include styrene, alkylstyrenes (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, benzylstyrene, chloromethylstyrene, trifluoromethylstyrene, ethoxymethylstyrene, acetoxymethylstyrene), alkoxystyrenes (e.g., methoxystyrene, 4-methoxy-3-methylstyrene, dimethoxystyrene), halogenated styrenes (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene), hydroxystyrenes (e.g., 4-hydroxystyrene, 3-hydroxystyrene, 2-hydroxystyrene, 4-hydroxy-3-methylstyrene, 4-hydroxy-3,5-dimethylstyrene, 4-hydroxy-3-methoxystyrene, 4-hydroxy-3-(2-hydroxybenzyl)styrene) and carboxystyrene; examples of usable crotonic acid esters include alkyl crotonates (e.g., butyl crotonate, hexyl crotonate, glycerine monocrotonate); examples of usable itaconic acid esters include dialkyl itaconates (e.g., dimethyl itaconate, diethyl itaconate, dibutyl itaconate); and examples of other usable copolymerizing monomers include dialkyl esters of maleic or fumaric acid (e.g., dimethyl maleate, dibutyl fumarate), maleic anhydride, maleimide, acrylonitrile, methacrylonitrile and maleylonitrile. In addition, other addition polymerizing unsaturated compounds capable of functioning as comonomer are generally usable.

Of those compounds, the monomers capable of enhancing the solubility in alkali, such as carboxyl group-containing monomers (e.g., carboxystyrene, N-(carboxyphenyl) acrylamide, N-(carboxyphenyl)methacrylamide), phenolic hydroxyl group-containing monomers (e.g., hydroxystyrene, N-(hydroxyphenyl)-acrylamide, N-(hydroxyphenyl)methacrylamide, hydroxyphenyl acrylate, hydroxyphenyl methacrylate) and maleimide, are preferred as the copolymerizing component.

The suitable proportion of other polymerizing monomers in the present resin is not higher than 50 mole %, preferably not higher than 30 mole %, to the total repeating units.

The acid-decomposable alkali-soluble Resin (A) containing the constitutional repeating units of formula (I) and, if desired, acid decomposable group-containing constitutional repeating units (preferably constitutional repeating units of formula (V), (VI) or (VII)), carboxyl group-containing constitutional repating units (preferably constitutional repeating units of formula (VIII), (IX) or (X)) or/and other polymerizing monomers can be synthesized by radical, cationic or anionic polymerization of unsaturated monomers corresponding to the foregoing constitutional repeating units respectively.

More specifically, the monomers as recited above are mixed in their respectively preferred proportions as mentioned above, and dissolved in an appropriate solvent so as to have a monomer concentration of about 10–40 weight %. Thereto, a polymerization catalyst is added and, if needed, heat is applied, thereby effecting the polymerization. Further, a chain transfer agent may be added to the polymerization system, if desired.

The weight average molecular weight (Mw, determined on a polystyrene basis) of acid-decomposable alkali-soluble resin (A) is at least 2,000, preferably from 3,000 to 1,000,000, more preferably from 3,000 to 200,000, particularly preferably from 4,000 to 100,000. When the resin has higher molecular weight, it can have the higher thermal resistance, but the lower developability. Therefore, the molecular weight of the resin is adjusted to a range proper to the balance between the foregoing two factors. The suitable molecular weight distribution (Mw/Mn) is from 1.0 to 5.0, preferably from 1.0 to 3.0. The smaller Mw/Mn value the resin (A) has, the higher heat resistance and the better image properties (e.g., resist pattern profile, defocus latitude) can be obtained.

The proportion of the resin (A) in the present photosensitive composition is from 50 to 99.7 weight %, preferably from 70 to 99 weight %, to the total solids.

The compound generating an acid upon irradiation with actinic rays or radiation, which is used as Component (B) of the present composition, can be properly selected from photo-initiators of photo cationic polymerization, photo-initiators of photo radical polymerization, photo-decolorants of dyes, photo-discoloration agents, the compounds generating acids upon irradiation with rays known in the field of microresist (such as ultraviolet rays of wavelengths of 400 to 200 nm and deep ultraviolet rays, particularly preferably g-line, h-line, i-line and XrF excimer laser beam), ArF excimer laser beam, electron beams, X-rays, molecular beams or ion beams, or mixtures of two or more of the above-recited ones.

Examples of other compounds usable as Component (B) of the invention, which can generate acids upon irradiation with actinic rays or radiation, include onium salts, such as the diazonium salts described, e.g., in S. I. Schlesinger, *Photogr. Sci. Eng.,* 18, 387(1974) and T. B. Bal et al., *Polymer,* 21, 423(1980), the ammonium salts disclosed, e.g., in U.S. Pat. Nos. 4,069,055, 4,069,056 and Re 27,992, and JP-A-3-140140, the phosphonium salts described, e.g., in D. C. Necker et al., *Macromolecules,* 17, 2468(1984), C. S. Wen et al., *Teh. Proc. Conf. Rad. Curing ASIA,* p. 478, Tokyo (October 1988), and U.S. Pat. Nos. 4,069,055 and 4,069,056, the iodonium salts described, e.g., in J. V. Crivello et al., *Macromolecules,* 10(6), 1307(1977) and *Chem. & Eng. News,* No. 28, p. 31 (1988), European Patents 104,143, 339,049 and 410,201, JP-A-2-150848 and JP-A-2-296514, the sulfonium salts described, e.g., in J. V. Crivello et al., *Polymer J.,* 17, 73(1985), J. V. Crivello et al., *J. Org. Chem.,* 43, 3055(1078), W. R. Wattetal., *J. Polymer Sci.,* Polymer Chem. Ed., 22, 1789(1984), J. V. Crivello et al., *J. Polymer Sci.,* Polymer Chem. Ed., 22,1789(1984), J. V. Crivello et al. *Polymer Bull.,* 14, 279(1985), J. V. Crivello et al., *Macromolecules,* 14(5), 1141(1981), J. V. Crivello et al., *J. Polymer Sci.,* Polymer Chem. Ed., 17, 2877(1979), European Patents 370,693, 161,811, 410,201, 339,049, 233,567, 297,443 and 297,442, U.S. Pat. Nos. 3,902,114, 4,933,377, 4,760,013, 4,734,444 and 2,833,827, German Patents 2,904, 626, 3,604,580 and 3,604,581, Jp-A-7-28237 and JP-A-8- 27102; the selenonium salts described, e.g., in J. V. Crivello et al., *Macromolecules,* 10(6), 1307(1977), and J. V. Crivello et al., *J. Polymer Sci.,* Polymer Chem. Ed., 17, 1047(1979), and the arsonium salts described, e.g., in C. S. Wen et al., *Teh. Proc. Conf. Rad. Curing ASIA,* p. 478, Tokyo (October 1988); the organic halogen compounds disclosed, e.g., in U.S. Pat. No. 3,905,815, JP-B-46-4605 (the term "JP-B" as used herein means an "examined Japanese patent publication"), JP-A-48-36281, JP-A-55-32070, JP-A-50- 239736, JP-A-61-169835, JP-A-61-169837, JP-A-62- 58241, JP-A-62-212401, JP-A-63-70243 and JP-A-63- 298339; the organometallic/organic halides described, e.g., in K. Meier et al., *J. Rad. Curing,* 13(4), 26(1986), T. P. Gill et al., *Inorg. Chem.,* 19, 3007(1080), D. Astruc, *Acc. Chem. Res.,* 19(12), 377(1896), and JP-A-2-161445; the photo-acid generators having protective groups of O-nitrobenzyl type described, e.g., in S. Hayase et al., *J. Polymer Sci.,* 25, 753(1987), E. Reichmanis et al., *J. Polymer Sci.,* Polymer Chem. Ed., 23, 1(1985), Q. Q. Zhu et al.,*J. Photo Chem.,* 36, 85, 39, 317(1987), B. Amit et al., *Tetrahedron Lett.,* (24), 2205(1973), D. H. R. Barton et al., *J. Chem. Soc.,* 3571 (1965), P. M. Collins et al., *J. Chem. SoC.,* Perkin 1, 1695(1975), M. Rudinstein et al., *Tetrahedron Lett.,* (17), 1445(1975), J. W. Walker et al., *J. Am. Chem. Soc.,* 110, 7170(1988), S. C. Busman et al.,*J. Imaging Technol.,* 11(4), 191(1985), H. M. Houlihan et al., *Macromolecules,* 21,2001 (1988), P. M. Collins et al.,*J. Chem. Soc., Chem. Commun.,* 532(1972), S. Hayase et al., *Macromolecules,* 18, 1799 (1985), E. Reichmanis et al., *J. Electrochem. Soc., Solid State Sci. Technol.,* 130(6), F. M. Houlihan et al., *Macromolecules,* 21, 2001(1988), European Patents 0,290, 750, 0,046,083, 0,156,535, 0,271,831 and 0,388,343, U.S. Pat. Nos. 3,901,710 and 4,181,531, JP-A-60-198538 and JP-A-53-133022; the compounds generating sulfonic acid by photolysis, representatives of which are iminosulfonates, as described, e.g., in M. Tunooka et al., *Polymer Preprints* Japan, 35(8), G. Berner et al., *J. Rad, Curing,* 13(4), W. J. Mijs et al., *Coating Technol.,* 55(697), 45(1983), Akzo H. Adachi et al., *Polymer Preprints,* Japan, 37 (3), European Patents 0,199,672, 0,085,515, 0,044,115, 0,618,564 and 0,101,122, U.S. Pat. Nos. 4,371,605 and 4,431,774, JP-A- 64-18143, JP-A-2-245756 and JP-A-3-140109; the disulfone compounds disclosed, e.g., in JP-A-61-166544 and JP-A-2-71270; and the diazoketosulfone and diazodisulfone compounds disclosed, e.g., in JP-A-3-103854, JP-A-3- 103856 and JP-A-4-210960.

In addition, the polymers containing groups or compounds generating acids upon exposure to light in the main chain or side chains, e.g., the compounds described in M. E. Woodhouse et al.,*J. Am. Chem. Soc.,* 104, 5586(1982), S. P. Pappas et al., *J. Imaging Sci.,* 30(5), 218(1986), S. Kondo et al., *Makromol. Chem., Rapid Commun.,* 9, 625(1988), Y. Yamada et al., *Makromol. Chem.,* 152, 153, 163(1972), J. V. Crivello et al., *J. Polymer Sci., Polymer Chem.* Ed., 17, 3845(1972), U.S. Pat. No. 3,849,137, German Patent 3,914, 407, JP-A-63-26653, JP-A-55-164824, JP-A-62-69263, JP-A-63-146038, JP-A-63-163452, JP-A-62-153853 and JP-A-63-146029, can be used.

Further, the compounds generating acids upon exposure to light as described, e.g., in V. N. R. Pillai, *Synthesis,* (1), 1(1980), A. Abad et al., *Tetrahedron Lett.,* (47), 4555(1971) D. H. R. Bartonetal.,*J. Chem. Soc.,* (C), 329(1970),U.S. Pat. No. 3,779,778 and European Patent 0,126,712 can be also used.

Of the compounds decomposing upon irradiation with actinic rays or radiation to generate acids (Component (B)), the compounds illustrated below can be used to particular advantage:

(1) Trihalomethyl group-substituted oxadiazole and s-triazine compounds represented by the following formulae (PAG1) and (PAG2) respectively:

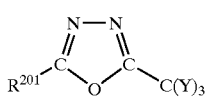
(PAG1)

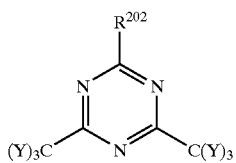
(PAG2)

wherein $R^{201}$ represents a substituted or unsubstituted aryl or alkenyl group; $R^{202}$ represents a substituted or unsubstituted aryl, alkenyl or alkyl group, or —C(Y)$_3$; and Y represents a chlorine or bromine atom.

Examples of such compounds are illustrated below, but it should be understood that these examples are not to be construed as limiting the scope of the invention.

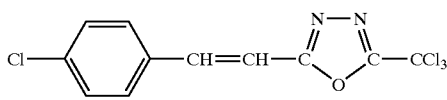
(PAG1-1)

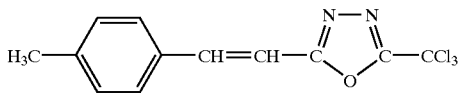
(PAG1-2)

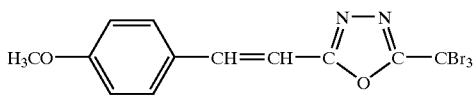
(PAG1-3)

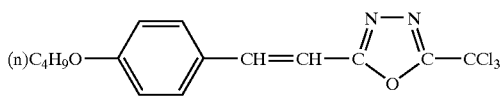
(PAG1-4)

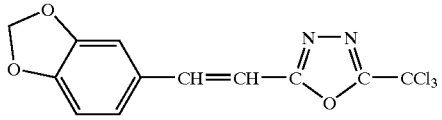
(PAG1-5)

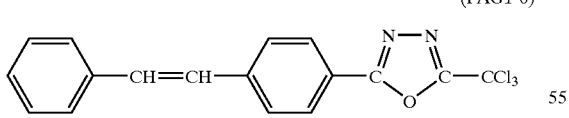
(PAG1-6)

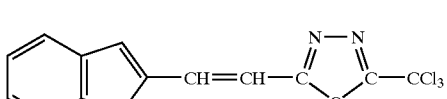
(PAG1-7)

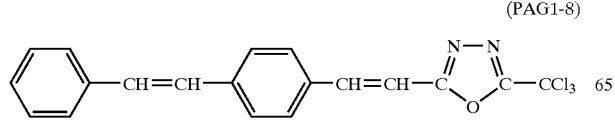
(PAG1-8)

-continued

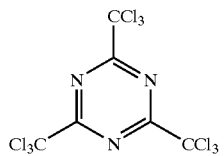
(PAG2-1)

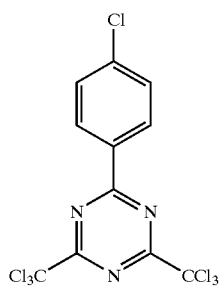
(PAG2-2)

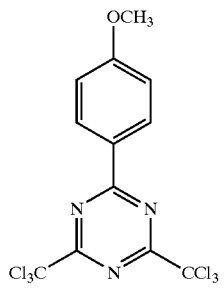
(PAG2-3)

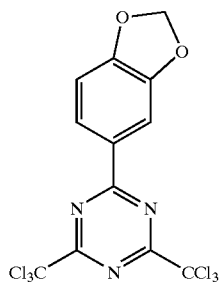
(PAG2-4)

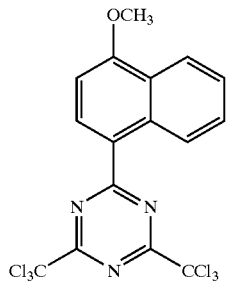
(PAG2-5)

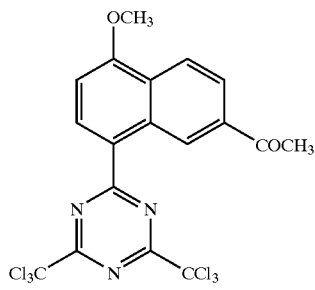
(PAG2-6)

-continued (PAG2-7)

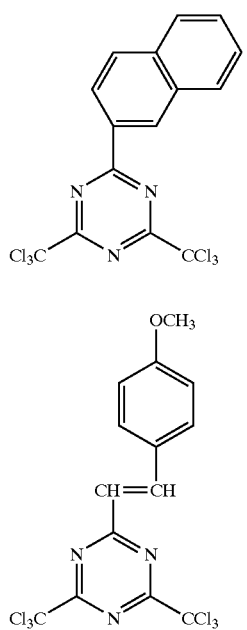

(PAG2-8)

(2) Iodinium and sulfonium salts represented by the following formulae (PAG3) and (PAG4) respectively:

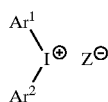
(PAG3)

-continued (PAG4)

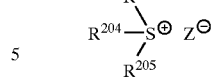

Herein, $Ar^1$ and $Ar^2$ are independent of each other, and each represents a substituted or unsubstituted aryl group. As suitable examples of a substituent the aryl group can have, mention may be made of an alkyl group, a haloalkyl group, a cycloalkyl group, an aryl group, an alkoxy group, a nitro group, a carboxyl group, an alkoxycarbonyl group, a hydroxyl group, a mercapto group and a halogen atom. $R^{203}$, $R^{204}$ and $R^{205}$ are independent of one another, and each represents a substituted or unsubstituted alkyl or aryl group, preferably an aryl group containing 6 to 14 carbon atoms, an alkyl group containing 1 to 8 carbon atoms or a substituted derivative thereof. Examples of a substituent suitable for the aryl group include an alkoxy group containing 1 to 8 carbon atoms, an alkyl group containing 1 to 8 carbon atoms, a nitro group, a carboxyl group, a hydroxyl group and a halogen atom; while examples of a substituent suitable for the alkyl group include an alkoxy group containing 1 to 8 carbon atoms, a carboxyl group and an alkoxycarbonyl group.

$Z^-$ represents a counter anion, with examples including $BF_4^-$, $AsF_6^-$, $PF_6^-$, $SbF_6^{2-}$, $SiF_6^{2-}$, $ClO_4^-$, a perfluoroalkanesulfonic acid anion (e.g., $CF_3SO_3^-$), pentafluorobenzenesulfonic acid anion, a condensed polynuclear aromatic sulfonic acid anion (e.g., naphthalene-1-sulfonic acid anion), anthraquinon-sulfonic acid anion and sulfonic acid group-containing dyes. However, the counter anions to constitute the iodinium and sulfonium salts should not be construed as being limited to those recited above.

Additionally, any two among $R^{203}$, $R^{204}$ and $R^{205}$, or $Ar^1$ and $Ar^2$ may combine with each other via a single bond or a substituent group.

Examples of such iodonium and sulfonium salts are illustrated below, but these examples should not be construed as limiting the scope of the invention.

(PAG3-1)
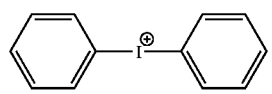 $C_8F_{17}SO_3^\ominus$ (PAG3-2)
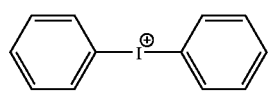 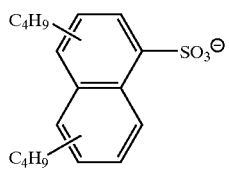

(PAG3-3)
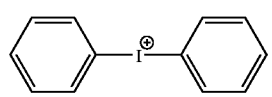 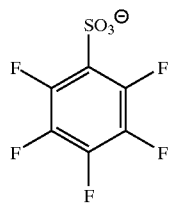

(PAG3-4)
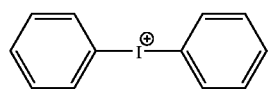 $CF_3SO_3^\ominus$

-continued
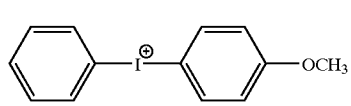
(PAG3-5)
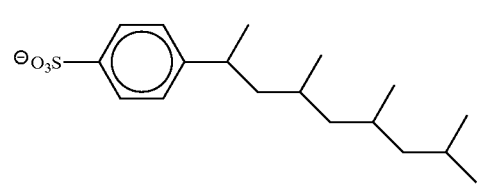
(PAG3-6)
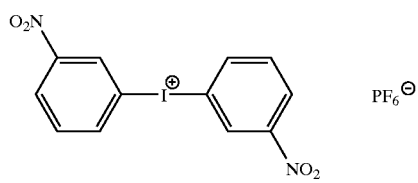 PF$_6^\ominus$
(PAG3-7)
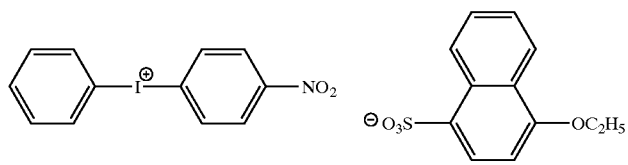
(PAG3-8)
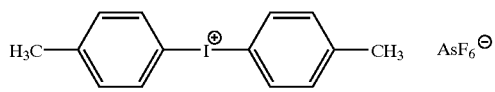 AsF$_6^\ominus$
(PAG3-9)
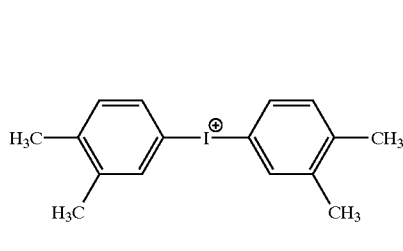 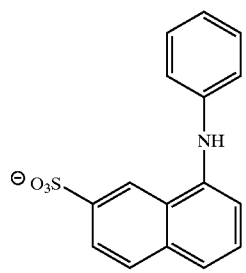
(PAG3-10)
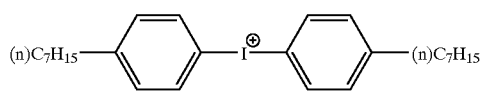 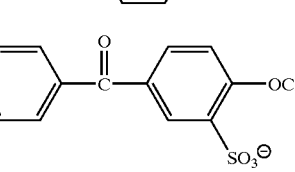
(PAG3-11)
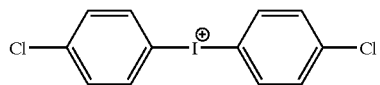 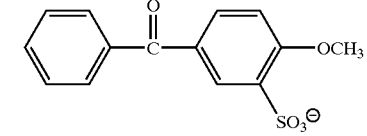
(PAG3-12)
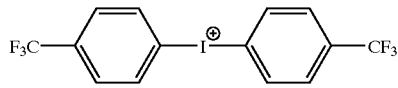 CF$_3$SO$_3^\ominus$
(PAG3-13)
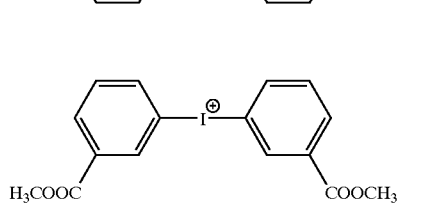 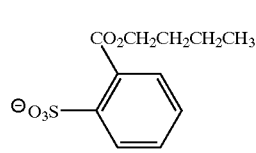

-continued
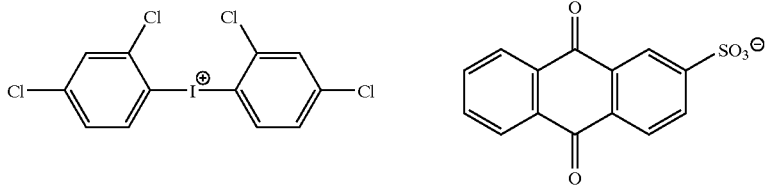 (PAG3-14)
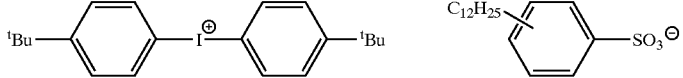 (PAG3-15)
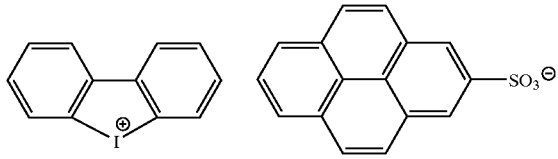 (PAG3-16)
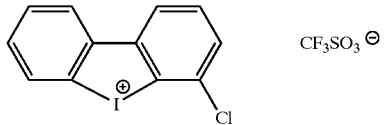 (PAG3-17)
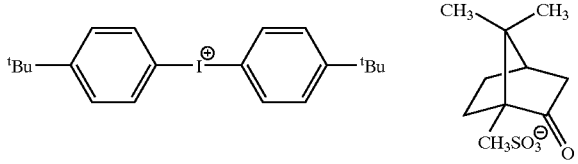 (PAG3-18)
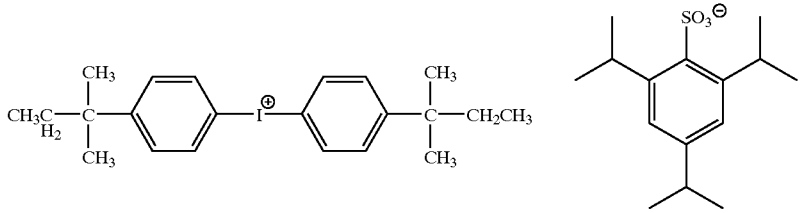 (PAG3-19)
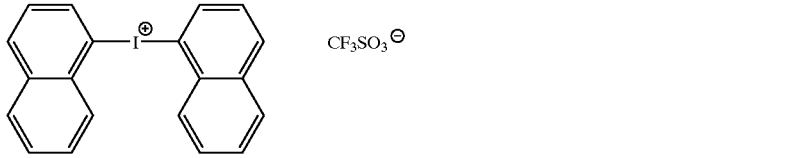 (PAG3-20)
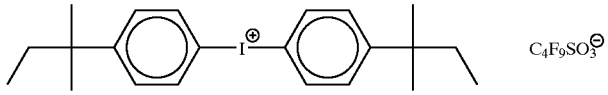 (PAG3-21)
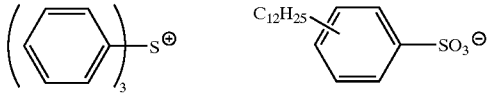 (PAG4-1)
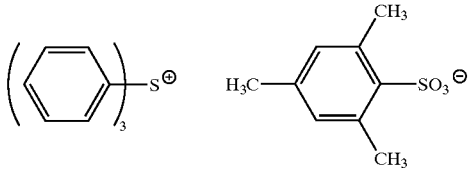 (PAG4-2)

-continued
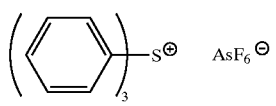 (PAG4-3)
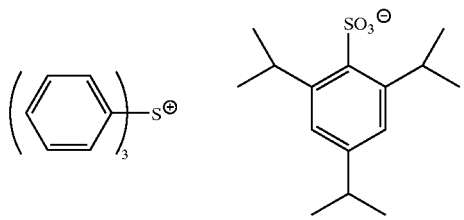 (PAG4-4)
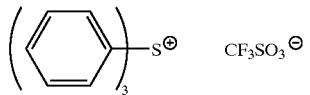 (PAG4-5)
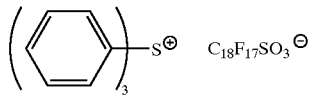 (PAG4-6)
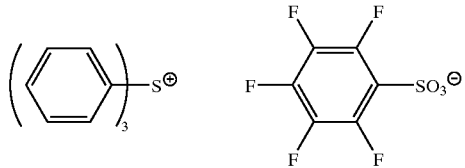 (PAG4-7)
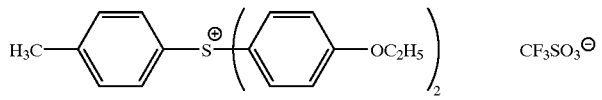 (PAG4-8)
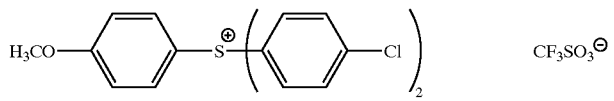 (PAG4-9)
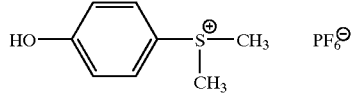 (PAG4-10)
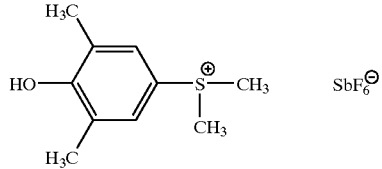 (PAG4-11)
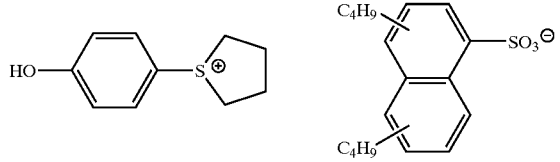 (PAG4-12)
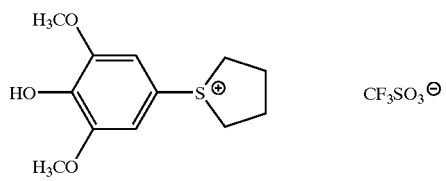 (PAG4-13)

-continued
(PAG4-14)
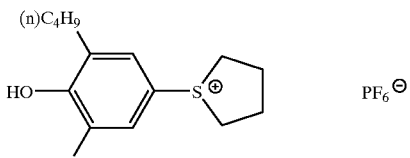
(PAG4-15)
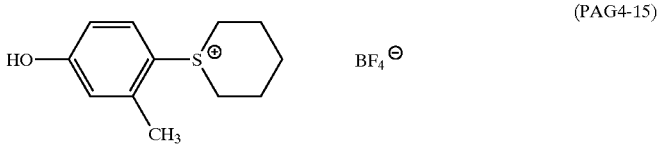
(PAG4-16)
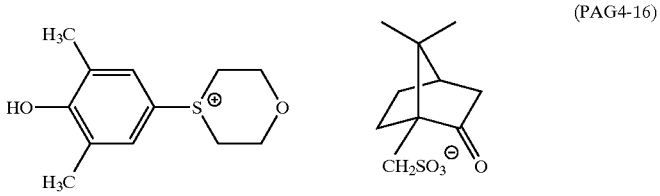
(PAG4-17)
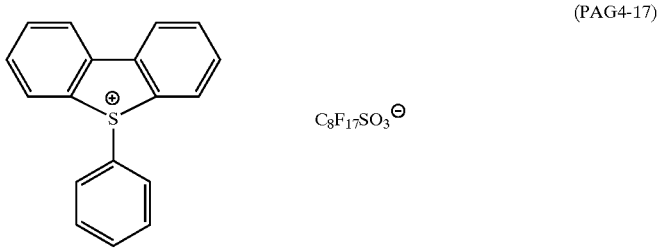
(PAG4-18)
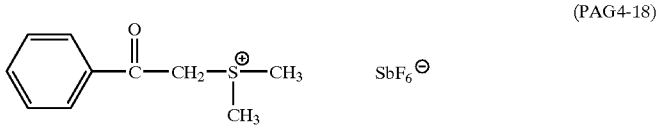
(PAG4-19)
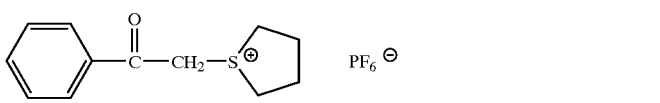
(PAG4-20)
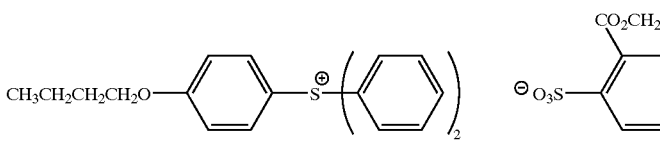
(PAG4-21)
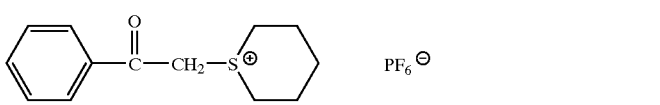
(PAG4-22)
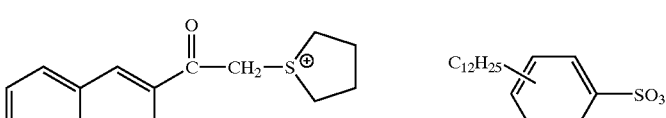
(PAG4-23)
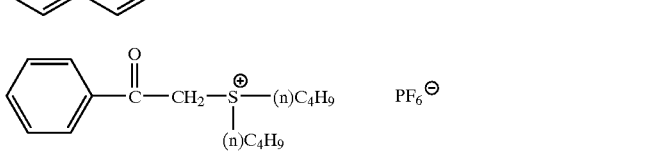
(PAG4-24)
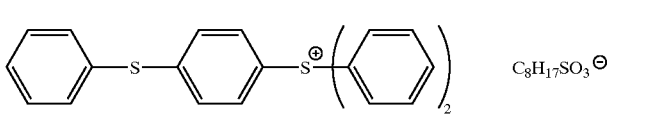

-continued
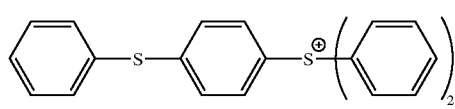 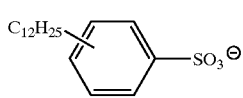 (PAG4-25)
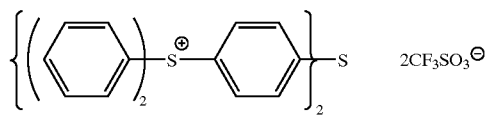 (PAG4-26)
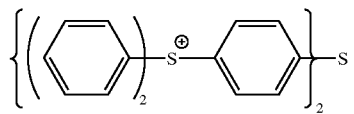 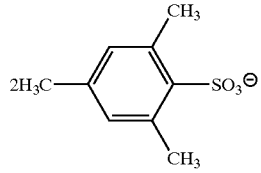 (PAG4-27)
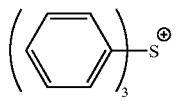 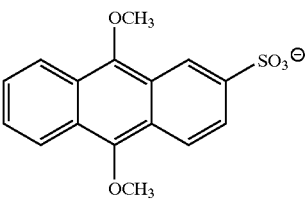 (PAG4-28)
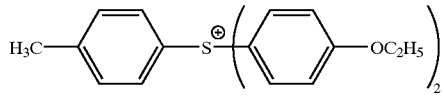 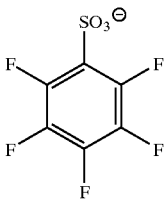 (PAG4-29)
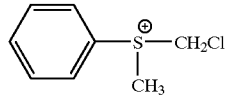 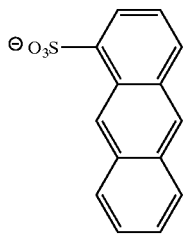 (PAG4-30)
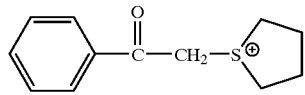 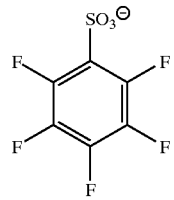 (PAG4-31)
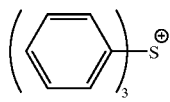 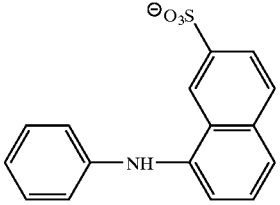 (PAG4-32)
The onium salts represented by formulae (PAG3) and (PAG4) are known compounds, and can be synthesized using the methods described, e.g., in J. W. Knapczyk et al., *J. Am. Chem. Soc.*, 91, 145(1969), A. L. Maycoketal.,*J. Org. Chem.*, 35,2532(1970), E. Goethas et al., *Bull. Soc. Chem. Belg.*, 73, 546(1964), H. M. Leicester, *J. Am. Chem. Soc.*, 51, 3587(1929), J. V. Crivello et al., *J. Polym. Chem. Ed.*, 18,2677(1980), U.S. Pat. Nos. 2,807,648 and 4,247,473, and JP-A-53-101331.

(3) Disulfone and iminosulfonate compounds represented by the following formulae (PAG5) and (PAG6) respectively:

$$Ar^3-SO_2-SO_2-Ar^4 \quad \text{(PAG5)}$$

(PAG6)

$$R^{206}-SO_2-O-N\begin{array}{c}\text{(with cyclic imide A)}\end{array}$$

wherein $Ar^3$ and $Ar^4$ are independent of each other, and each represents a substituted or unsubstituted aryl group; $R^{206}$ represents a substituted or unsubstituted alkyl or aryl group; and A represents a substituted or unsubstituted alkylene, alkenylene or arylene group.

Examples of such compounds are illustrated below, but these examples should not be construed as limiting the scope of the invention.

(PAG6-3)
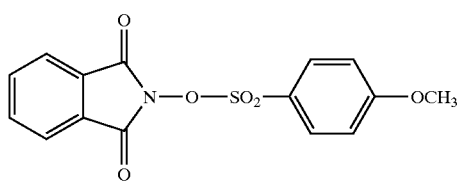
(PAG6-4)
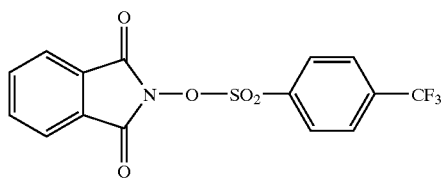
(PAG6-5)
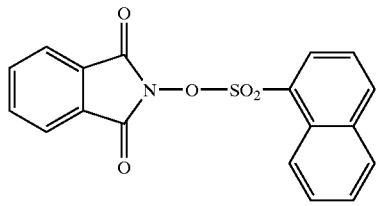
(PAG6-6)
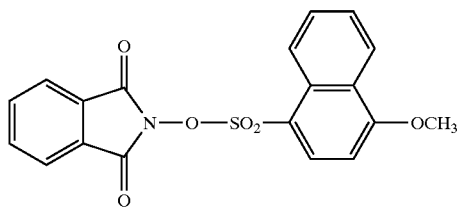
(PAG6-7)
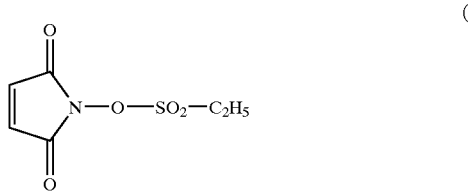
(PAG6-8)
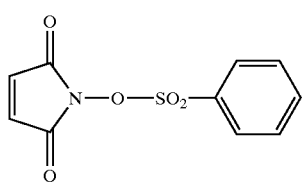
(PAG6-9)
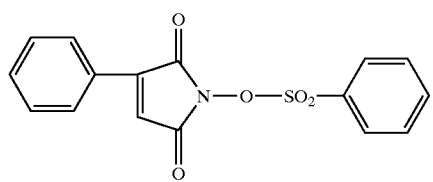
(PAG6-10)
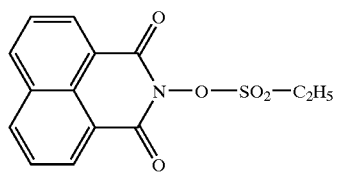
(PAG6-11)
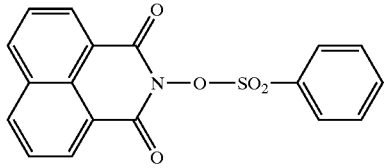
(PAG6-12)
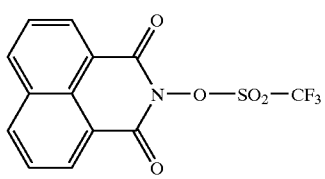
(PAG6-13)
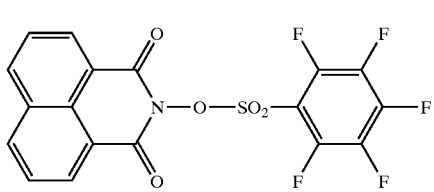
(PAG6-14)
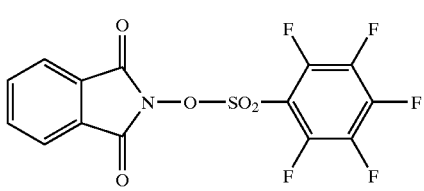
(PAG6-15)
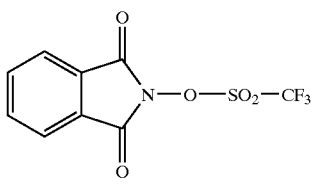
(PAG6-16)
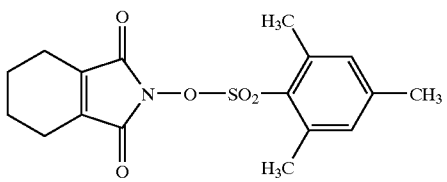
(PAG6-17)
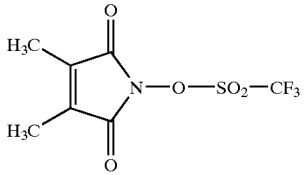
(PAG6-18)

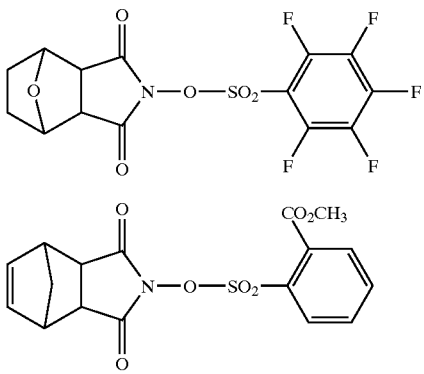

(PAG6-19)

(PAG6-20)

(4) Diazodisulfone compound represented by the following formula (PAG7):

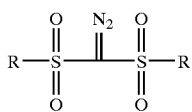

(PAG7)

wherein R represents a straight-chain, branched or cyclic alkyl group, or an unsubstituted or substituted aryl group.

Examples of such a compound are illustrated below, but these examples should not be construed as limiting the scope of the invention.

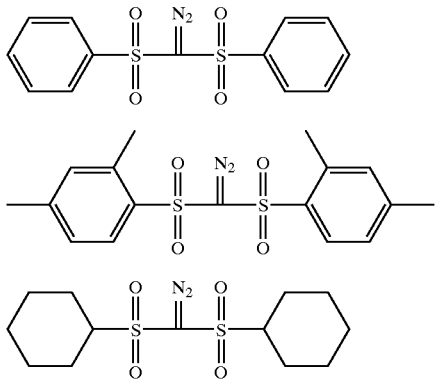

(PAG7-1)

(PAG7-2)

(PAG7-3)

The proportion of those compounds decomposing upon irradiation with actinic rays or radiation to generate acids (Component (B)) is generally from 0.001 to 40 weight %, preferably from 0.01 to 20 weight %, more preferably from 0.1 to 5 weight %, to the total weight (on a solids basis) of the present composition. When the proportion of the compounds as Component (B) is lower than 0.001 weight %, the sensitivity is lowered; while, when it is higher than 40 weight %, the resulting resist shows too high absorption of light, and thereby the profile is deteriorated and the process margin, particularly bake margin, is rendered narrow.

Then, the fluorine-containing surfactant and silicon-containing surfactant for Component (C) of the present positive photosensitive composition are illustrated.

In the present positive photosensitive composition, either a fluorine-containing surfactant or a silicon-containing surfactant, or both of them can be contained as Component (C). Such surfactants are referred to as Surfactant (C) hereinafter.

By containing acid-decomposable alkali-soluble Resin (A) and Surfactant (C), the present positive photosensitive composition can show satisfactory sensitivity and resolution when exposed to light of wavelengths of 250 nm or shorter, particularly 220 nm or shorter, to provide resist patterns having excellent adhesion and reduced development defects.

Examples of Surfactant (C) include the surfactants disclosed in U.S. Pat. Nos. 5,405,720, 5,360,692, 5,529,881, 5,296,330, 5,436,098, 5,576,143, 5,294,511, and 5,824,451, JP-A-62-36663, JP-A-61-226746, JP-A-61-226745, JP-A-62-170950, JP-A-63-34540, JP-A-7-230165, JP-A-8-62834, JP-A-9-54432 and JP-A-5988. Further, the following commercially produced surfactants can be used as they are.

As examples thereof, mention may be made of the fluorine and/or silicon-containing surfactants available in the following trade names, EFtop EP301 and EP303 (produced by Shin-Akita Kasei K.K.), Florad FC430, 431 (produced by Sumitomo 3M Inc.), Megafac F171, F173, F176, F189, R08 (produced by Dainippon Ink & Chemicals Inc.) and Surflon S-382, SC 101, 102, 103, 104, 105, 106 (produced by Asahi Glass Co., Ltd.). In addition, the polysiloxane polymer KP-341 (produced by Shin-etsu Chemical Co., Ltd.) can also be used as silicon-containing surfactant.

The proportion of Surfactant (C) used is generally from 0.001 to 2 weight %, preferably from 0.01 to 1 weight %, to the total solids in the present composition.

Those surfactants can be used alone or as a mixture of two or more thereof.

The present positive photosensitive composition can further contain a nitrogen-containing basic compound as Component (D) (which is referred to as nitrogen-containing basic Compound (D) hereinafter).

It is desirable for the nitrogen-containing basic Compound (D) to have the following structure (a) to (e):

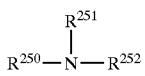

(a)

wherein $R^{250}$, $R^{251}$ and $R_{252}$, which may be the same or different, each represents a hydrogen atom, an alkyl group containing 1 to 6 carbon atoms, an aminoalkyl group containing 1 to 6 carbon atoms, a hydroxyalkyl group containing 1 to 6 carbon atoms, or a substituted or unsubstituted aryl group containing 6 to 20 carbon atoms;

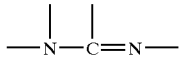

(b)

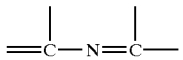

(c)

(d)

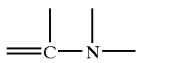

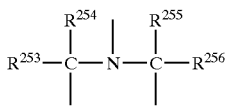

(e)

wherein $R^{253}$, $R^{254}$, $R^{255}$ and $R_{256}$, which may be the same or different, each represents an alkyl group containing 1 to 6 carbon atoms, and $R^{254}$ and $R^{255}$ may combine with each other to form a ring.

More desirable compounds are basic compounds having at least two per molecule of nitrogen atoms put in chemically different environments, and especially desirable ones are compounds having in a molecule both a substituted or unsubstituted amino group and a nitrogen-containing cyclic structure or an alkyl amino group.

Suitable examples of nitrogen-containing basic compound (D) include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine, and a substituted or unsubstituted aminoalkylmorpholine. As suitable examples of substituent groups the compounds recited above can have, mention may be made of an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Of such basic compounds, guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethyl -piperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazabicyclo[4,3,0]nona-5-ene, 1,8-diazabicyclo-[5,4,0]undeca-7-ene and 2,4,5-triphenylimidazole are preferred in particular. However, the compounds particularly preferred as nitrogen-containing basic compound (D) should not be construed as being limited to the compounds recited above.

Those nitrogen-containing basic compounds may be used alone or as a mixture of two or more thereof. The proportion of nitrogen-containing basic Compound (D) used is generally from 0.001 to 10 weight %, preferably from 0.01 to 5 weight %, to the total solids in the photosensitive composition. The effect produced by the addition of nitrogen-containing basic Compound (D) in a proportion less than 0.001 weight % is negligibly small; while the addition of Compound (D) in a proportion more than 10 weight % tends to cause deterioration in the sensitivity and the developability of the unexposed area.

Furthermore, the present positive photosensitive composition can contain as Component (E) a low molecular compound having a molecular weight of at most 3,000 and a group decomposing under the action of an acid to cause an increase of the solubility in an alkali developer. The Component (E) functions as acid decomposable dissolution inhibitive compound. Also, the Component (E) may contain groups represented by formula (I).

In order not to lower the transmittance, particularly at wavelengths not longer than 220 nm, it is desirable to used as Component (E) alicyclic or aliphatic compounds, such as cholic acid derivatives described in *Proceeding of SPIE*, 27, 24, 355(1966). When the acid decomposable dissolution inhibitive compound is used in the invention, the suitable proportion thereof is from 3 to 50 weight %, preferably from 5 to 40 weight %, more preferably from 10 to 35%, to the total solids in the photosensitive composition.

Examples of a compound usable as Component (E) are illustrated below, but it should be understood that these examples are not to be construed as limiting the scope of the invention.

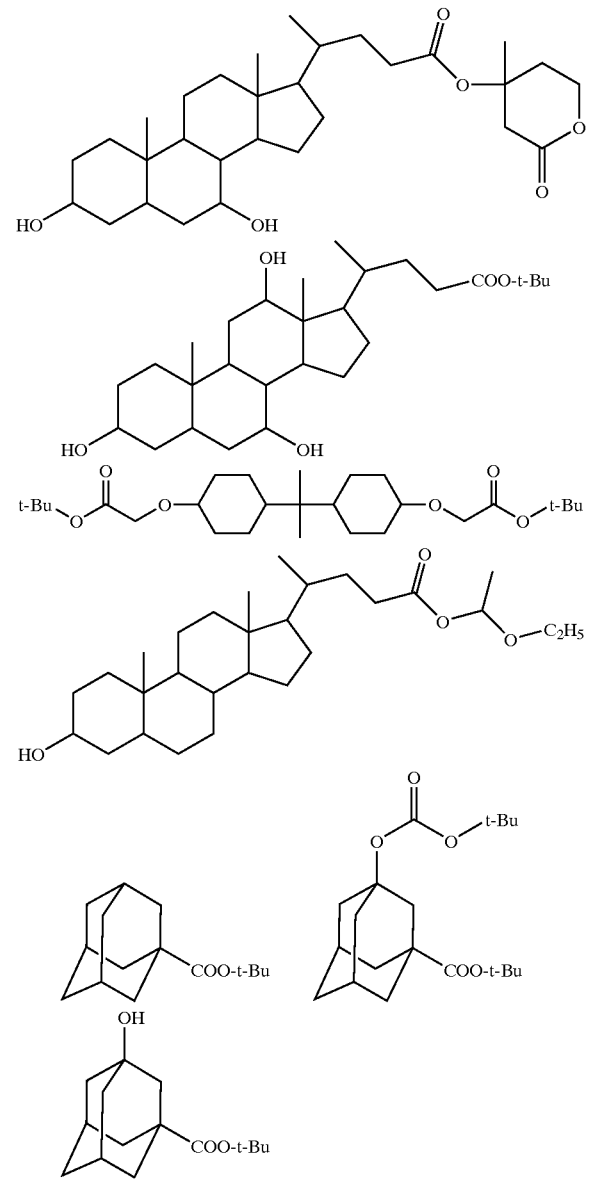

The present positive photoresist composition can contain as Component (F) an acid decomposable group-free resin which is insoluble in water but soluble in an alkali developer (hereinafter referred to as alkali-soluble Resin (F), too), and thereby the sensitivity thereof can be enhanced. As the acid decomposable group-free alkali-soluble Resin (F), the resins having constitutional repeating units containing carboxyl groups (preferably those represented by formula (VIII), (IX) or (X)) are advantageously used. In such Resin (F), the constitutional repeating units derived from comonomers as recited hereinbefore may be contained for adjusting the solubility in alkali, or/and the alicyclic group-containing constitutional repeating units represented by formula (II), (III) or (IV) may be contained for heightening the dry etching resistance.

Although novolak resins and poly(hydroxystyrene) derivatives may also be used in the invention, it is desirable to use them in a partly hydrogenated form or in a proportion of at most 30 weight % to the total resins, because they show strong absorption at wavelengths not longer than 250 nm.

Furthermore, the present positive photosensitive composition can contain acid decomposable dissolution accelerative compounds, dyes, plasticizers, surfactants other than Component (C), photosensitizers and compounds capable of increasing the solubility in a developer, if desired.

As the compounds capable of increasing the solubility in a developer, the low molecular compounds having molecular weight of at most 1,000 and containing at least two phenolic OH groups or at least one carboxyl group per molecule can be used in the invention. Of the compounds containing carboxyl groups, the alicyclic or aliphatic ones are preferred for the reason mentioned above.

The suitable proportion of these dissolution accelerative compounds added is from 2 to 50 weight %, preferably from 5 to 30 weight %, to the present resin. It is undesirable to add such compounds in a proportion greater than 50 weight %, because it makes development residue serious and causes deformation of patterns upon development.

By reference to, e.g., JP-A-4-122938, JP-A-2-28531, U.S. Pat. No. 4,916,210 and European Patent No. 219294, such phenol compounds having molecular weight of at most 1,000 can be synthesized with ease by persons skilled in the art.

Examples of such a phenol compound are the following, but the compounds usable in the invention should not be construed as being limited to the compounds recited below: The compounds are resorcinol, phloroglucinol, 2,3,4-trihydroxybenzophenone, 2,3,4,4'-tetrahydroxybenzophenone, 2,3,4,3',4',5'-hexahydroxybenzophenone, acetone-pyrogallol condensed resin, phloroglucide, 2,4,2',4'-biphenyltetrol, 4,4'-thiobis(1,3-dihydroxy)benzene, 2,2',4,4'-tetrahydroxydiphenyl ether, 2,2',4,4'-tetrahydroxydiphenyl sulfoxide, 2,2',4,4'-tetrahydroxydiphenylsulfone, tris(4-hydroxyphenyl)methane, 1,1-bis(4-hydroxyphenyl)cyclohexane, 4,4-(α-methylbenzylidene)bisphenol, α,α',α"-tris(4-hydroxyphenyl)-1,3,5-triisopropylbenzene, α,α',α"-tris(4-hydroxyphenyl)-1-ethyl-4-isopropylbenzene, 1,2,2-tris(hydroxyphenyl)propane, 1,1,2-tris(3,5-dimethyl-4-hydroxyphenyl)propane, 2,2,5,5-tetrakis(4-hydroxyphenyl)hexane, 1,1,2,2-tetrakis(4-hydroxyphenyl)ethane, 1,1,3-tris(hydroxyphenyl)butane and para[α,α,α',α'-tetrakis(4-hydroxyphenyl)]xylene.

The dyes suitable for the present composition are oil-soluble dyes and basic dyes, with examples including Oil Yellow #101, Oil Yellow #103, Oil Pink #312, Oil Green BG, Oil Blue BOS, Oil Blue #603, Oil Black BY, Oil Black BS, Oil Black T-505 (which are all products of Orient Kagaku Kogyo K.K.), Crystal Violet (CI42555), Methyl Violet (CI42535), Rhodamine B (CI45170B), Malachite Green (CI42000) and Methylene Blue (CI52015).

In order to raise the rate of acid generation by exposure, the photosensitizers as recited below can further be added. Suitable examples thereof include benzophenone, p,p'-tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzil, Acridine Orange, benzoflavin, Setoflavin-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin) and coronene. However, the photosensitizers usable in the invention should not be construed as being limited to those compounds.

Further, those photosensitizers are usable as light absorbent when far ultraviolet light is employed for exposure. The addition of such a light absorbent can produce an improving effect on standing wave because it decreases the reflected light from the substrate to reduce the influence of multiple reflection inside the resist film.

The components constituting the present photosensitive composition are all dissolved in a proper solvent, and coated on a support. Suitable examples of a solvent used therein include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethylacetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone and tetrahyfrofuran. These solvents can be used alone or as a mixture of two or more thereof.

Besides the Surfactant (C) mentioned above, namely the fluorine-containing and/or silicon-containing surfactants, other surfactants may be added to the present composition. Examples thereof include nonionic surfactants, such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkyl aryl ether s (e.g., polyoxyethylene octyl phenol ether, polyoxyethylene nonyl phenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate) and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate). These surfactants can be added in a proportion of 2 weight % at the most, preferably 1 weight % at the most, to the total solids in the present composition.

Those surfactants may be added alone or as a combination of two or more thereof.

The photosensitive composition prepared in the foregoing manner is coated on a substrate (e.g., coated with silicon/silicon dioxide) as used for production of precision integrated circuit elements by means of an appropriate coating apparatus, such as a spinner or a coater, exposed to light of appropriate wavelengths via the desired mask, subjected to PEB (post-exposure bake), and then developed to provide resist patterns of good quality. Herein, the suitable light for exposure is far ultraviolet light of wavelengths of 250 nm or shorter, preferably 220 mn or shorter. Examples of exposure light usable in the invention include KrF excimer laser beam (248 nm), ArF excimer laser beam (193 nm), $F_2$ excimer laser beam (157 nm), X-rays and elctron beams.

Examples of a developer usable for the present photosensitive composition include alkaline aqueous solutions of inorganic alkalis, such as sodium hydroxide, potassium hydroxide, sodium carbonate, sodium silicate, sodium metasilicate and aqueous ammonia; primary amines, such as ethylamine and n-propylamine; secondary amines, such as diethylamine and di-n-butylamine; tertiary amines, such as triethylamine and methyldiethylamine; alcholamines, such as dimethylethanolamine and triethanolamine; quaternary ammonium salts, such as tetramethylammonium hydroxide and tetraethylammonium hydroxide; and cyclic amines, such as pyrrole and piperidine.

Also, the alkaline aqueous solutions as recited above can further contain alcohols and surfactants in appropriate amounts.

The present invention will now be illustrated in more detail by reference to the following examples, which are not to be considered as limiting on or determinative of the scope of the invention.

SYNTHESIS EXAMPLE 1

Synthesis of Resin (I-1); (a1)/(b1)=50/50

A solution containing 5.0 g of 2-methyl-2-adamantane methacrylate, 4.23 g of mevalonic lactone methacrylate and 0.534 g of 2,2'-azobis(2,4-dimethylvaleronitrile) as polymerization initiator (V-65, trade name, produced by Wako Pure Chemical Industries, Ltd.) in 30.0 g of N,N-dimethylacetamide was added dropwise to 7.0 g of N,N-dimethylacetamide heated at 60° C. in a stream of nitrogen over a period of 4 hours. The polymerization reaction was continued for additional 2 hours at 60° C. Then, 0.267 g of V-65 was further added, and the reaction was further continued for 2 hours. The reaction solution obtained was poured into 1,000 ml of ion exchange water to deposit a powdery matter. The powdery matter was filtered off, dissolved in THF, and poured into 1,500 ml of hexane. The thus obtained powdery matter was dried to yield Resin (I-1).

The resin obtained had a molecular weight of 5,500 and the dispersion degree (Mw/Mn) thereof was 1.9.

SYNTHESIS EXAMPLE 2

Synthesis of Resin (I-2); (a5)/(b1)=50/50

A solution containing 5.0 g of 2-methyl-2-adamantane methacrylate, 3.9 g of α-methacryloyloxy-γ-butyrolactone and 0.534 g of 2,2'-azobis(2,4-dimethylvaleronitrile) as polymerization initiator (V-65, trade name, produced by Wako Pure Chemical Industries Ltd.) in 27 g of N,N-dimethylacetamide was added dropwise to 7.0 g of N,N-dimethylacetamide heated at 60° C. in a stream of nitrogen over a period of 4 hours. The polymerization reaction was continued for additional 2 hours at 60° C. Then, 0.267 g of V-65 was further added, and the reaction was further continued for 2 hours. The reaction solution obtained was poured into 1,000 ml of ion exchange water to deposit a powdery matter. The powdery matter was filtered off, dissolved in THF, and poured into 1,500 ml of hexane. The thus obtained powdery matter was dried to yield Resin (I-2).

The resin obtained had a molecular weight of 7,600 and the dispersion degree thereof was 1.8.

SYNTHESIS EXAMPLE 3

Synthesis of Resin (I-3); (a3)/(b1)=50/50

Resin (I-3) was synthesized in the same manner as described above, except that (a3) was employed instead of (a1) or (a5). The resin obtained had a molecular weight of 6,600 and the dispersion degree thereof was 2.0.

SYNTHESIS EXAMPLE 4

Synthesis of Resin (I-4); (a4)/(b2)=50/50

Resin (I-4) was synthesized in the same manner as described above, except that (a4) was employed instead of (a1), (a5) or (a3) and (b2) was employed instead of (b1). The resin obtained had a molecular weight of 8,300 and the dispersion degree thereof was 1.7.

SYNTHESIS EXAMPLE 5

Synthesis of cholic acid t-butyl ester:

Cholic acid t-butyl ester was synthesized using the method described in J. Photopolym. Sci. Technol., vol. 11, No.3, p.467(998).

Additionally, this ester is designated as "Compound a" in Table 1.

Example 1 to 4 and Comparative Examples 1 and 2

Preparation of Photoresin Compositions

The ingredients set forth in Table 1, including the acid-decomposable alkali-soluble Resin (A) synthesized in Synthesis Example 1, 2, 3 or 4, photo-acid Generator (B), Surfactant (C) and nitrogen-containing basic Compound (D), were admixed in their respective amounts set forth in Table 1 with 4.5 g of propylene glycol monomethyl ether acetate (PEGMEA).

After mixing the foregoing ingredients together, the mixture obtained was subjected to filtration with a 0.2 $\mu$m Teflon filter, thereby preparing each photoresin composition.

The thus prepared photoresin compositions were each examined for number of development defects and resist image quality in accordance with the following evaluation methods respectively. The evaluation results are shown in Table 2.

Evaluation Method of Development Defects (1) Development Defects I

Each photoresin composition was coated uniformly on a hexamethyldisilazane-treated silicon substrate by means of a spin coater, and dried by 90-second heating on a 120° C. hot plate to be formed into a 0.50 $\mu$m-thick resist film. This resist film was exposed to ArF excimer laser beam via a mask. Immediately after the exposure, the resist film was heated for 90 seconds on a 110° C. hot plate. Then, it was developed with a 2.38 weight % aqueous solution of tetramethylammonium hydroxide for 60 seconds at 23° C., rinsed with pure water for 30 seconds, and then dried. Thus, contact hole patterns were formed on each resist film, and the number of development defects generated therein was counted (under the condition of threshold 12 and pixcel size of 0.39) with a KLA 2112 machine (produced by KLA Tenkohl).

(2) Development Defects II

The number of development defects was examined by the same method as adopted for the examination of the foregoing development defects I, except that each resist film underwent no exposure.

Evaluation Method of Image Quality

DUV-42 (a product of Brewer Science Inc.) was coated uniformly as a 600 angstrom-thick reflection preventing film on a hexamethyldisilazane-treated silicon substrate by means of a spin coater and dried for 90 seconds on a 100° C. hot plate. Further, the heating at 190° C. was continued for 240 seconds to complete the drying of the coated film. Thereafter, each photoresin composition was coated on the reflection preventing film by means of a spin coater, and dried for 90 seconds at 130° C., thereby forming a 0.50 μm-thick resist film. Each resist film was exposed to ArF excimer laser beam via a mask, and immediately underwent 90-second heating on a 130° C. hot plate. Further, it was developed for with a 2.38% water solution of tetramethylammonium hydroxide for 60 seconds at 23° C., rinsed with pure water for 30 seconds, and then dried to provide resist line patterns.

The sensitivity was expressed in terms of the exposure amount required for reproducing the 0.25 μm mask pattern.

The resolution was expressed in terms of the threshold resolution under exposure enabling the reproduction of 0.25 μm mask pattern.

TABLE 1

| | Acid decomposable Alkali-soluble Resin (A) | Photo-acid Generator (B) | Surfactant (C) | N-containing Basic Compound (D) | Acid Decomposable Low Molecular Compound (E) |
|---|---|---|---|---|---|
| Comparative Example 1 | I-1 1.0 g | PAG-1 0.03 g | W-4 0.005 g | DBN 0.004 g | — |
| Comparative Example 2 | I-2 1.0 g | PAG-1 0.03 g | W-4 0.005 g | DBN 0.004 g | — |
| Example 1 | I-1 1.0 g | PAG-1 0.03 g | W-1 0.005 g | DBN 0.004 g | — |
| Example 2 | I-2 1.0 g | PAG-1 0.03 g | W-2 0.005 g | DBN 0.004 g | — |
| Example 3 | I-3 1.0 g | PAG-1 0.03 g | W-3 0.005 g | DBN 0.004 g | — |
| Example 4 | I-4 0.9 g | PAG-1 0.03 g | W-1 0.005 g | DBN 0.004 g | Compound a 0.1 g |

The symbols in Table 1 stand for the following compounds, respectively;

PAG-1: Triphenylsulfonium triflate (the same as PAG 4–5 illustrated hereinbefore)

DBN: 1,5-Diazabicyclo[4.3.0]-5-nonene

W-1: Megafac F176 (produced by Dai-Nippon Ink & Chemicals Inc.) (fluorine-containing surfactant)

W-2: Megafac R08 (produced by Dai-Nippon Ink & Chemicals Inc.) (fluorine and silicon-containing surfactant)

W-3: Polysiloxane polymer KP-341 (produced by Shin-Etsu Chemical Co., Ltd.)

W-4: Polyoxyethylene nonyl phenyl ether

Compound a: T-butyl ester of cholic acid

TABLE 2

| | Sensitivity (mj/cm$^2$) | Resolution (μm) | Development Defects I | Development Defects II |
|---|---|---|---|---|
| Compar. Example 1 | 16 | 0.22 | 35 | 94 |
| Compar. Example 2 | 25 | 0.23 | 42 | 105 |
| Example 1 | 15 | 0.22 | 8 | 23 |
| Example 2 | 24 | 0.23 | 16 | 40 |
| Example 3 | 24 | 0.22 | 18 | 30 |
| Example 4 | 22 | 0.22 | 19 | 38 |

As can be seen from Table 2, the present positive photosensitive compositions had excellent image performance such as resolution and sensitivity, and moreover surmounted the development defects problem. On the other hand, the comparative positive photosensitive compositions caused serious development defects although the sensitivity and resolution were equivalent to those of the present compositions.

When exposed to deep ultraviolet rays, particularly to far ultraviolet rays of wavelengths of 220 nm or shorter, the positive photosensitive compositions according to the present invention can show high sensitivity and high resolution to ensure high quality in the resist image formed therefrom, and moreover solve the development defects problem. In addition, the present compositions can provide resist having excellent adhesion and dry etching resistance.

While the invention has been described in detail and with reference to specific embodiments thereof, it will be apparent to one skilled in the art that various changes and modifications can be made therein without departing from the spirit and scope thereof.

What is claimed is:

1. A positive photosensitive composition comprising:

(A) a resin comprising repeating units represented by the following formula (I) and having groups capable of decomposing under the action of an acid to cause an increase of the solubility in an alkali developer, and further comprising cyclic hydrocarbon group-containing repeating units, (B) a photo-acid generator capable of generating an acid upon irradiation with actinic rays or radiation, (C) at least one of a fluorine-containing surfactant and a silicon-containing surfactant; and (D) a nitrogen-containing basic compound having a structure represented by formula (b), (c), (d) or (e):

wherein $R^{253}$, $R^{254}$, $R^{255}$ and $R^{256}$, which may be the same or different, each represents an alkyl group containing 1 to 6 carbon atoms, and $R^{254}$ and $R^{255}$ may combine with each other to form a ring;

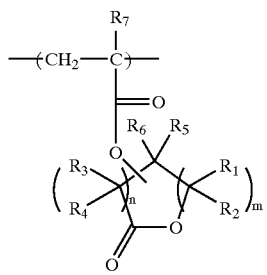

(I)

wherein $R_1$ to $R_6$, which are the same or different, each represents a hydrogen atom, an alkyl group, an alkoxy group, a hydroxyl group or a halogen atom, or at least two among $R_1$ to $R_6$ may combine with each other to form a ring, and one of $R_1$ to $R_6$ is a single bond linking the ring structure to the oxygen atom; $R_7$ represents a hydrogen atom, a halogen atom, a cyano group, an alkyl group or a haloalkyl group; m is an integer of 0 to 2; and n is an integer of 0 to 2.

2. The positive photosensitive composition of claim 1, wherein the sum of m and n in formula (I) is 2.

3. The positive photosensitive composition of claim 1, wherein, in formula (I), m and n each is 1 and the —COO— residue is bonded to $R_3$ or $R_4$ of the lactone residue through a single bond.

4. The positive photosensitive composition of claim 1, wherein the photo-acid generator (B) is an iodonium salt whose anion is a fluoroalkanesulfonic acid ion or a sulfonium salt whose anion is a fluoroalkanesulfonic acid ion.

5. The positive photosensitive composition of claim 1, further comprising (E) a low molecular compound having a molecular weight of 3,000 or less and a group capable of decomposing under the action of an acid to cause an increase of the solubility in an alkali developer.

6. The positive photosensitive composition of claim 1, wherein the actinic rays or radiation used for irradiation is far ultraviolet light having a wavelength of 250 nm or shorter.

7. The positive photosensitive composition of claim 6, wherein the far ultraviolet light is light having a wavelength of 220 nm or shorter.

8. The positive photosensitive composition of claim 1, wherein the resin (A) further comprises constitutional repeating units represented by formula (II):

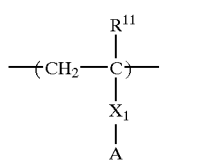

(II)

wherein $R^{11}$ represents a hydrogen atom, a halogen atom, a cyano group, an alkyl group or a haloalkyl group; $X_1$ represents a single bond, a divalent unsubstituted or substituted alkylene, alkenylene or cycloalkylene group, —O—, —SO$_2$—, —OCO—R$_{26}$—, —CO—O—R$_{27}$— or —CO—NR$_{28}$—R$_{29}$—; R$_{28}$ represents a hydrogen atom or an unsubstituted or substituted alkyl, cycloalkyl or alkenyl group; R$_{26}$, R$_{27}$ and R$_{29}$, which may be the same or different, each represents a single bond, or an alkylene, alkenylene or cycloalkylene group which may combine with an ether, ester, amido, urethane or ureido linkage to form another divalent group; and A represents a monocyclic or polycyclic hydrocarbon group.

9. The positive photosensitive composition of claim 8, wherein A represents a substituted or unsubstituted alicyclic moiety having the following structure (40):

(40).

10. The positive photosensitive composition of claim 8, wherein $X_1$ represents —CO—O—R$_{27}$—, where R$_{27}$ represents a single bond, or an alkylene, alkenylene or cycloalkylene group which may combine with an ether, ester, amido, urethane or ureido linkage to form another divalent group; and $R^{11}$ represents a hydrogen atom or an alkyl group.

11. The positive photosensitive composition of claim 1, wherein the nitrogen-containing basic compound (D) is selected from the group consisting of a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine, a substituted or unsubstituted aminoalkylmorpholine; wherein the substituent group is selected from the group consisting of an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

12. The positive photosensitive composition of claim 1, wherein the nitrogen-containing basic compound (D) is selected from the group consisting of guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl) piperazine, N-(2-aminoethyl)piperidine, 4-amino-2,2,6,6-tetramethyl-piperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazabicyclo[4,3,0]nona-5-ene, 1,8-diazabicycl-[5,4,0]undeca-7-ene and 2,4,5-triphenylimidazole.

13. The positive photosensitive composition of claim 1, wherein the nitrogen-containing basic compound is 1,5-diazabicyclo[4,3,0]nona-5-ene.

\* \* \* \* \*